(12) United States Patent
Hosoya et al.

(10) Patent No.: US 8,273,614 B2
(45) Date of Patent: Sep. 25, 2012

(54) SEMICONDUCTOR DEVICE AND METHOD OF MANUFACTURING THE SAME

(75) Inventors: Kunio Hosoya, Kanagawa (JP); Saishi Fujikawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 218 days.

(21) Appl. No.: 12/842,070

(22) Filed: Jul. 23, 2010

(65) Prior Publication Data

US 2010/0304538 A1    Dec. 2, 2010

Related U.S. Application Data

(62) Division of application No. 12/016,767, filed on Jan. 18, 2008, now Pat. No. 7,777,224.

(30) Foreign Application Priority Data

Jan. 30, 2007    (JP) ................................ 2007-019662

(51) Int. Cl.
    *H01L 21/84*    (2006.01)
    *H01L 21/336*   (2006.01)

(52) U.S. Cl. ........ 438/158; 438/149; 438/151; 438/720; 438/30; 257/223; 257/227; 257/E21.704; 257/59

(58) Field of Classification Search .................. 257/223, 257/227, 291, 292, 439, 443, 655, E27.1, 257/E27.125, E27.112, E29.117, E29.145, 257/E29.147, E29.151, E29.182, E29.202, 257/E29.273–E29.299, E29.314, E29.32, 257/E23.016; 438/30–38, 146–158, 455, 438/720

See application file for complete search history.

(56) References Cited

U.S. PATENT DOCUMENTS

| | | | |
|---|---|---|---|
| 5,652,453 A | 7/1997 | Iwamatsu et al. | |
| 5,821,563 A | 10/1998 | Yamazaki et al. | |
| 6,166,397 A | 12/2000 | Yamazaki et al. | |
| 6,228,721 B1 | 5/2001 | Yu | |
| 6,261,881 B1 | 7/2001 | Yamazaki et al. | |
| 6,278,131 B1 | 8/2001 | Yamazaki et al. | |
| 6,316,787 B1 | 11/2001 | Ohtani | |
| 6,359,320 B1 | 3/2002 | Yamazaki et al. | |
| 6,459,124 B1 | 10/2002 | Zhang et al. | |
| 6,472,684 B1 | 10/2002 | Yamazaki et al. | |
| 6,562,669 B2 | 5/2003 | Suzawa et al. | |
| 6,593,592 B1 | 7/2003 | Yamazaki et al. | |
| 6,709,901 B1 | 3/2004 | Yamazaki et al. | |
| 6,806,495 B1 | 10/2004 | Yamazaki et al. | |
| 6,855,957 B1 | 2/2005 | Yamazaki et al. | |
| 6,900,084 B1 | 5/2005 | Yamazaki | |
| 7,022,556 B1 | 4/2006 | Adachi | |
| 7,045,438 B2 | 5/2006 | Yamazaki et al. | |
| 7,102,718 B1 | 9/2006 | Yamazaki et al. | |
| 2002/0113268 A1 | 8/2002 | Koyama et al. | |
| 2006/0051914 A1 | 3/2006 | Kakehata et al. | |

FOREIGN PATENT DOCUMENTS

JP    06-037313    2/1994

*Primary Examiner* — Mamadou Diallo
(74) *Attorney, Agent, or Firm* — Nixon Peabody LLP; Jeffrey L. Costellia

(57) ABSTRACT

To reduce variation among TFTs in manufacture of a semiconductor device including n-type thin film transistors and p-type thin film transistors. Further, another object of the present invention is to reduce the number of masks and manufacturing steps, and manufacturing time. A method of manufacturing a semiconductor device includes forming an island-shaped semiconductor layer of a first thin film transistor, then, forming an island-shaped semiconductor layer of the second thin film transistor. In the formation of the island-shaped semiconductor layer of the second thin film transistor, a gate insulating film in contact with the island-shaped semiconductor layer of the second thin film transistor is used as a protection film (an etching stopper film) for the island-shaped semiconductor layer of the first thin film transistor.

16 Claims, 18 Drawing Sheets

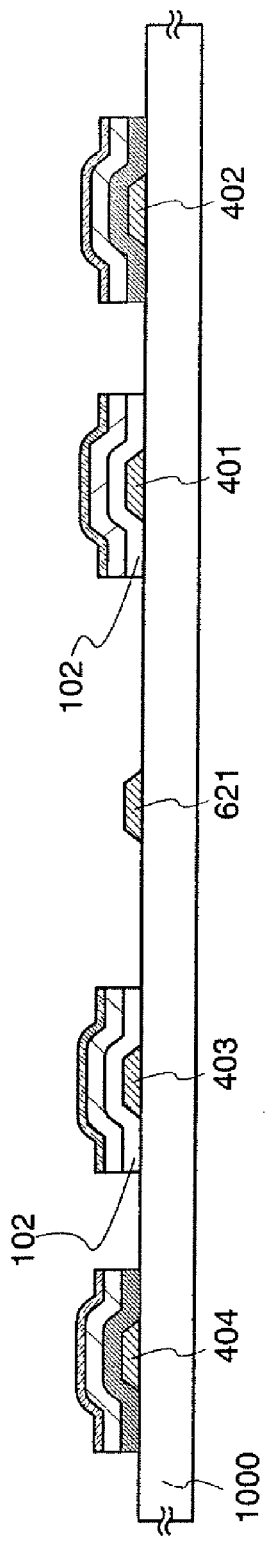
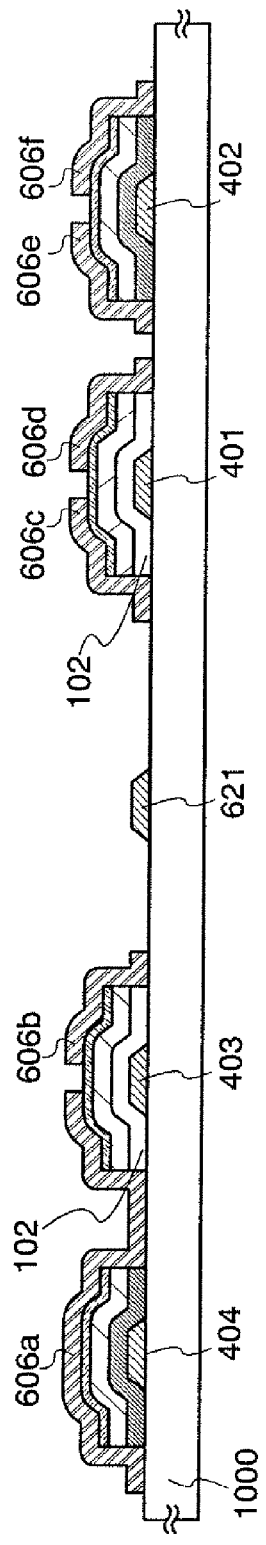
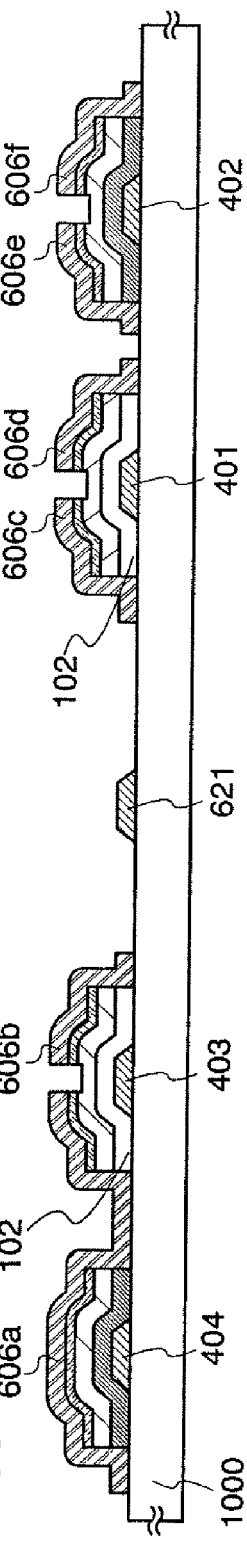

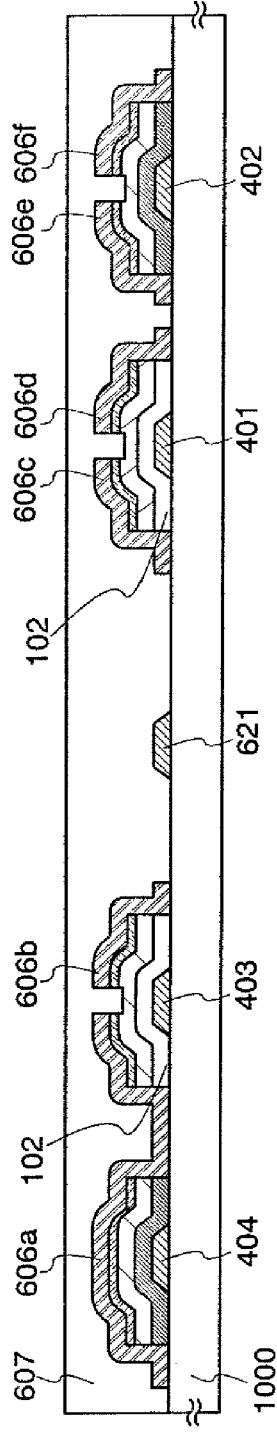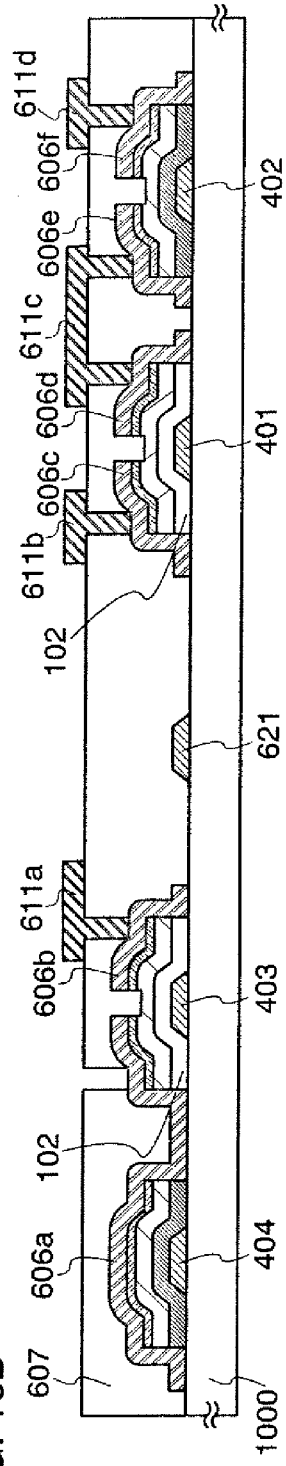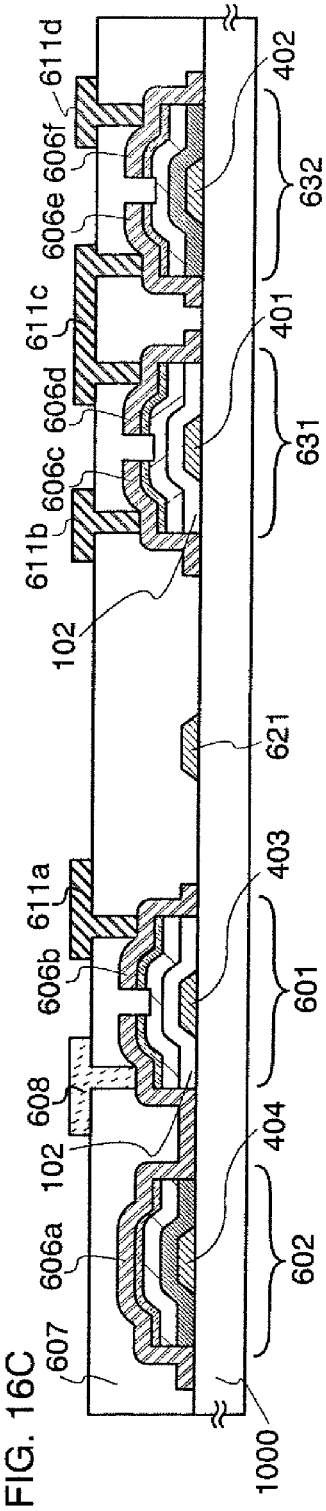

SEMICONDUCTOR DEVICE AND METHOD OF MANUFACTURING THE SAME

BACKGROUND OF THE INVENTION

1. Field of the Invention

The present invention relates to semiconductor devices and methods of manufacturing semiconductor devices.

2. Description of the Related Art

In recent years, flat panel displays such as liquid crystal display devices and electroluminescence (EL) display devices have attracted attention.

Driving methods of these flat panel displays include a passive matrix method and an active matrix method. An active matrix method has advantages over a passive matrix method such as the fact that power consumption is lowered, definition is heightened, a larger substrate can be used, and the like.

Further, when an active matrix method is used, pixel TFTs and a driver circuit for driving the pixel TFTs can be formed over the same substrate. Note that a TFT refers to a thin film transistor.

A circuit has superior characteristics (e.g., low power consumption and high-speed response) in the case where the circuit includes both n-type thin film transistors (NTFTs) and p-type thin film transistors (PTFTs), compared with the case where the circuit includes either n-type thin film transistors or p-type thin film transistors.

For example, Patent Document 1 (Japanese Published Patent Application No. H6-37313) discloses a method of forming n-type thin film transistors and p-type thin film transistors in which impurity doping by an ion implantation method is utilized.

Impurity doping by an ion implantation method refers to a method in which an ionized impurity (a dopant) is accelerated by high voltage and implanted into a semiconductor.

Therefore, when an ion implantation method is used, source and drain regions in a semiconductor layer are damaged by ion implantation and resistance thereof increases. If the resistance of the source and drain regions in the semiconductor layer increases, operation of a TFT is delayed or stopped.

Accordingly, an anneal should be performed in order to recover the damage so that the resistance of the source and drain regions is lowered. However, if an anneal is performed, crystallinity of channel formation regions in the semiconductor layer tends to vary at random from TFT to TFT.

This is because the channel formation region is randomly crystallized by high temperature treatment such as an anneal when the crystallinity of the channel formation region is low (this tendency is particularly evident when the channel formation region is formed of an amorphous semiconductor). Therefore, electrical characteristics vary from TFT to TFT due to an anneal.

In addition, an anneal results in increase in the number of manufacturing steps and in manufacturing time.

Further, in a TFT manufacturing process which requires high temperature treatment such as an anneal, TFTs can not be directly formed over a substrate with low heat resistance (e.g., a substrate formed of a resin material).

Further, in an ion implantation method, variation in the amount of ions implanted easily occurs due to an apparatus. Examples of variation due to an apparatus include variation in the amount of ions implanted from lot to lot due to degradation of filament, and variation in the amount of ions implanted into a substrate due to contaminants in a process chamber (when the process is performed repeatedly, a dopant becomes dust and adheres to an inner wall of the process chamber, an electrode, or the like).

As an alternative to an ion implantation method, there is a thermal diffusion method.

In a thermal diffusion method, a heat-resistant mask is formed using a heat-resistant material (e.g., a silicon oxide), high temperature heat treatment (equal to or higher than 800° C.) is performed in an atmosphere containing an impurity element which imparts conductivity, and then, the heat-resistant mask is removed.

Since heating treatment in a thermal diffusion method is performed at higher temperature than heat treatment in an ion implantation method, a problem of an ion implantation method cannot be solved.

Further, in an ion implantation method, separate masks for implanting an n-type dopant and a p-type dopant are necessary.

A thermal diffusion method requires different masks: a heat-resistant mask for selectively diffusing an n-type dopant and a heat-resistant mask for selectively diffusing a p-type dopant.

Further, in a thermal diffusion method, a mask (e.g., a resist) which cannot withstand processing at 800° C. or higher is used to form a mask which can withstand processing at 800° C. or higher. Accordingly, problems of increase in the number of manufacturing steps and in manufacturing time are caused.

SUMMARY OF THE INVENTION

An object of the present invention is to reduce variation among TFTs in manufacture of a semiconductor device including n-type thin film transistors and p-type thin film transistors. Further, another object of the present invention is to reduce the number of masks and manufacturing steps, and manufacturing time.

One of an n-type thin film transistor and a p-type thin film transistor is referred to as a first thin film transistor. The other one of the n-type thin film transistor and the p-type thin film transistor is referred to as a second thin film transistor. The first and second thin film transistors have inverted staggered structures.

An inverted staggered structure has a semiconductor layer including a channel formation region, a source region, and a drain region; a gate electrode under the channel formation region with a gate insulating film interposed therebetween; and wirings over the source and drain regions. In addition, the channel formation region is interposed between the source region and the drain region.

A semiconductor device of the present invention includes n-type and p-type thin film transistors whose semiconductor layers have parts in which a non-doped semiconductor layer and a doped semiconductor layer are stacked in that order.

In this specification, the non-doped semiconductor layer refers to a non-doped semiconductor film etched into a desired shape, and the doped semiconductor layer refers to a doped semiconductor film etched into a desired shape.

The non-doped semiconductor film refers to a semiconductor film which is formed without using a gas which contains an impurity element which imparts conductivity to a semiconductor as a film-forming gas. The doped semiconductor film refers to a semiconductor film which is formed using a gas which contains an impurity element which imparts conductivity to a semiconductor as a film-forming gas.

An impurity element which imparts conductivity to a semiconductor is a donor element (e.g., phosphorus or arsenic) or an acceptor element (e.g., boron). A gas containing a donor element is used as a film-forming gas for a doped semiconductor film of an n-type thin film transistor, while a gas containing an acceptor element is used as a film-forming gas for a doped semiconductor film of a p-type thin film transistor.

One aspect of the present invention is a method of manufacturing a semiconductor device, which includes forming an island-shaped semiconductor layer of a first thin film transistor, and then, forming an island-shaped semiconductor layer of a second thin film transistor. In this method, when the island-shaped semiconductor layer of the second thin film transistor is formed, a gate insulating film which is in contact with the island-shaped semiconductor layer of the second thin film transistor is used as a protection film (an etching stopper film) for the island-shaped semiconductor layer of the first thin film transistor.

The island-shaped semiconductor layer has a structure in which a non-doped semiconductor layer and a doped semiconductor layer are stacked in that order.

Such a method of manufacturing a semiconductor device according to the present invention includes removing the protection film (the etching stopper film) over the island-shaped semiconductor layer of the first thin film transistor after forming the island-shaped semiconductor layer of the second thin film transistor.

Further, such a method of manufacturing a semiconductor device according to the present invention includes forming a wiring after removing the protection film, and partially removing the doped semiconductor layer with the wiring serving as a mask to form (define) a semiconductor layer having a channel formation region, a source region, and a drain region.

One aspect of the present invention is a method of manufacturing a semiconductor device which includes forming a gate insulating film, a non-doped semiconductor film, and a doped semiconductor film successively.

To form films successively means to successively form a plurality of films which are stacked over a substrate without the substrate being exposed to an outside atmosphere, within one apparatus; that is, to successively stack a plurality of films over a substrate in one apparatus without any of the plurality of films being exposed to an outside atmosphere.

One aspect of the present invention is a semiconductor device which includes a first thin film transistor having a first gate electrode, a first gate insulating film formed over the first gate electrode, and a semiconductor layer formed over the first gate insulating film, including a first non-doped semiconductor layer and a first doped semiconductor layer having one of n-type and p-type conductivity stacked in that order; and a second thin film transistor having a second gate electrode, a second gate insulating film formed over the second gate electrode, and a semiconductor layer formed over the second gate insulating film, including a second non-doped semiconductor layer and a second doped semiconductor layer having the other one of n-type and p-type conductivity stacked in that order. In such a semiconductor device, a thickness of the first gate insulating film is different from a thickness of the second gate insulating film.

In such a semiconductor device of the present invention, the first and second thin film transistors are channel-etch type transistors.

A channel-etch type transistor refers to one type of inverted staggered thin film transistor and is formed as follows: a wiring is formed over a semiconductor layer in which a non-doped semiconductor layer and a doped semiconductor layer are stacked, and a part of the doped semiconductor layer (a part which overlaps with a channel formation region) is removed with the wiring serving as a mask.

Since the non-doped semiconductor layer which serves as a channel formation region is slightly etched in that removal, a thin film transistor formed as described above is referred to as a channel-etch type thin film transistor.

One aspect of the present invention is a semiconductor device which includes a first thin film transistor having a first gate electrode, a first gate insulating film formed over a first gate electrode, and a semiconductor layer formed over the first gate insulating film, including a first non-doped semiconductor layer and a first doped semiconductor layer having one of n-type and p-type conductivity stacked in that order; and a second thin film transistor having a second gate electrode, the first gate insulating film formed over the second gate electrode, a second gate insulating film formed over the first gate insulating film, and a semiconductor layer formed over the second gate insulating film, including a second non-doped semiconductor layer and a second doped semiconductor layer having the other one of n-type and p-type conductivity stacked in that order.

One aspect of the present invention is a semiconductor device which includes a first thin film transistor having a first gate electrode, a first gate insulating film formed over the first gate electrode, and a semiconductor layer formed over the first gate insulating film, including a first non-doped semiconductor layer and a first doped semiconductor layer having one of n-type and p-type conductivity stacked in that order; a second thin film transistor having a second gate electrode, a second gate insulating film formed over the second gate electrode, and a semiconductor layer formed over the second gate insulating film, including a second non-doped semiconductor layer and a second doped semiconductor layer having the other one of n-type and p-type conductivity stacked in that order; a third thin film transistor having a third gate electrode, the first gate insulating film formed over the third gate electrode, and a semiconductor layer formed over the first gate insulating film, including a third non-doped semiconductor layer and a third doped semiconductor layer having the one of n-type and p-type conductivity stacked in that order; and a storage capacitor including a lower electrode, the second gate insulating film formed over the lower electrode, and a semiconductor layer formed over the second gate insulating film, including a fourth non-doped semiconductor layer and a fourth doped semiconductor layer having the other one of n-type and p-type conductivity stacked in that order.

In such a semiconductor device of the present invention, a thickness of the second gate insulating film is smaller than a thickness of the first gate insulating film.

In such a semiconductor device of the present invention, the one of n-type and p-type conductivity is an n-type while the other one of n-type and p-type conductivity is a p-type.

In such a semiconductor device of the present invention, the third thin film transistor and the storage capacitor are electrically connected.

One aspect of the present invention is a semiconductor device which includes a peripheral circuit portion and a pixel portion which is electrically connected to the peripheral circuit portion. In such a semiconductor device, the peripheral circuit portion includes the first and the second thin film transistors and the pixel portion includes the third thin film transistor and the storage capacitor, the thickness of the second gate insulating film is smaller than the thickness of the first gate insulating film, the one of n-type and p-type conductivity is an n-type and the other one of n-type and p-type conductivity is a p-type, and the third thin film transistor and the storage capacitor are electrically connected.

One aspect of the present invention is a semiconductor device which includes a first thin film transistor having a first gate electrode, a first gate insulating film formed over the first gate electrode, and a semiconductor layer formed over the first gate insulating film, including a first non-doped semiconductor layer and a first doped semiconductor layer having one of n-type and p-type conductivity stacked in that order; a second thin film transistor having a second gate electrode, the first gate insulating film formed over the second gate electrode, a second gate insulating film formed over the first gate insulating film, and a semiconductor layer formed over the second gate insulating film, including a second non-doped semiconductor layer and a second doped semiconductor layer having the other one of n-type and p-type conductivity stacked in that order; a third thin film transistor having a third gate electrode, the first gate insulating film formed over the third gate electrode, the second gate insulating film formed over the first gate insulating film, and a semiconductor layer formed over the second gate insulating film, including a third non-doped semiconductor layer and a third doped semiconductor layer having the other one of n-type and p-type conductivity stacked in that order; and a storage capacitor including a lower electrode, the first gate insulating film formed over the lower electrode, and a semiconductor layer formed over the first gate insulating film, including a fourth non-doped semiconductor layer and a fourth doped semiconductor layer having the one of n-type and p-type conductivity stacked in that order.

In such a semiconductor device of the present invention, the one of n-type and p-type conductivity is a p-type while the other one of n-type and p-type conductivity is an n-type.

In such a semiconductor device of the present invention, the third thin film transistor and the storage capacitor are electrically connected.

One aspect of the present invention is a semiconductor device which includes a peripheral circuit portion and a pixel portion which is electrically connected to the peripheral circuit portion. In such a semiconductor device, the peripheral circuit portion includes the first and the second thin film transistors and the pixel portion includes the third thin film transistor and the storage capacitor, the one of n-type and p-type conductivity is a p-type while the other one of n-type and p-type conductivity is an n-type, and the third thin film transistor and the storage capacitor are electrically connected.

In such a semiconductor device of the present invention, the first to third thin film transistors are channel-etch type transistors.

One aspect of the present invention is a method of manufacturing a semiconductor device, which includes forming a first gate electrode and a second gate electrode over a substrate; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film which are over the second gate electrode; removing the first gate insulating film which is over the second gate electrode; forming a second gate insulating film, a second non-doped semiconductor film, and a second doped semiconductor film having the other one of n-type and p-type conductivity in that order over the first doped semiconductor film, which is over the first gate electrode, and the second gate electrode; removing the second non-doped semiconductor film and the second doped semiconductor film which are over the first gate electrode; removing the second gate insulating film; forming a wiring over the first doped semiconductor film and the second doped semiconductor film; and partially removing the first doped semiconductor film and the second doped semiconductor film with the wiring serving as a mask.

One aspect of the present invention is a method of manufacturing a semiconductor device, which includes forming a first gate electrode and a second gate electrode over a substrate; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film which are over the second gate electrode; forming a second gate insulating film, a second non-doped semiconductor film, and a second doped semiconductor film having the other one of n-type and p-type conductivity in that order over the first doped semiconductor film which is over the first gate electrode, and the first gate insulating film which is over the second gate electrode; removing the second non-doped semiconductor film and the second doped semiconductor film from over the first gate electrode; removing the second gate insulating film; forming a wiring over the first doped semiconductor film and the second doped semiconductor film; and partially removing the first doped semiconductor film and the second doped semiconductor film with the wiring serving as a mask.

One aspect of the present invention is a method of manufacturing a semiconductor device, which includes forming a first gate electrode and a second gate electrode over a substrate; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film which are over the second gate electrode; removing the first gate insulating film which is over the second gate electrode; forming a second gate insulating film, a second non-doped semiconductor film, and a second doped semiconductor film having the other one of n-type and p-type conductivity in that order over the first doped semiconductor film, which is over the first gate electrode, and the second gate electrode; removing the second non-doped semiconductor film and the second doped semiconductor film which are over the first gate electrode, with the second gate insulating film serving as an etching stopper film, and then, removing the second gate insulating film; forming a wiring over the first doped semiconductor film and the second doped semiconductor film; and partially removing the first doped semiconductor film and the second doped semiconductor film with the wiring serving as a mask.

One aspect of the present invention is a method of manufacturing a semiconductor device, which includes forming a first gate electrode and a second gate electrode over a substrate; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film which are over the second gate electrode; forming a second gate insulating film, a second non-doped semiconductor film, and a second doped semiconductor film having the other one of n-type and p-type conductivity in that order over the first doped semiconductor film which is over the first gate electrode, and the first gate insulating film over the second gate electrode; removing the second non-doped semiconductor film and the second doped semiconductor film which are over the first gate electrode with the second gate insulating film serving as an etching stopper film, and then, removing the second gate insulating film; forming a wiring over the first doped semiconductor film and the second doped semiconductor film; and partially removing the first doped semiconductor film and the second doped semiconductor film with the wiring serving as a mask.

One aspect of the present invention is a method of manufacturing a semiconductor device, which includes forming a first gate electrode and a second gate electrode over a substrate; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film which are over the second gate electrode; removing the first gate insulating film which is over the second gate electrode; forming a second gate insulating film, a second non-doped semiconductor film, and a second doped semiconductor film having the other one of n-type and p-type conductivity in that order over the first doped semiconductor film, which is over the first gate electrode, and the second gate electrode; removing the second non-doped semiconductor film and the second doped semiconductor film which are over the first gate electrode using conditions in which the etching rate of the second gate insulating film is lower than the etching rate of the second non-doped semiconductor film; removing the second gate insulating film using conditions in which the etching rate of the first doped semiconductor film is lower than the etching rate of the second gate insulating film; forming a wiring over the first doped semiconductor film and the second doped semiconductor film; and partially removing the first doped semiconductor film and the second doped semiconductor film with the wiring serving as a mask.

One aspect of the present invention is a method of manufacturing a semiconductor device, which includes forming a first gate electrode and a second gate electrode over a substrate; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film which are over the second gate electrode; forming a second gate insulating film, a second non-doped semiconductor film, and a second doped semiconductor film having the other one of n-type and p-type conductivity in that order over the first doped semiconductor film, which is over the first gate electrode, and the first gate insulating film over the second gate electrode; removing the second non-doped semiconductor film and the second doped semiconductor film which are over the first gate electrode using conditions in which the etching rate of the second gate insulating film is lower than the etching rate of the second non-doped semiconductor film; removing the second gate insulating film using conditions in which the etching rate of the first doped semiconductor film is lower than the etching rate of the second gate insulating film; forming a wiring over the first doped semiconductor film and the second doped semiconductor film; and partially removing the first doped semiconductor film and the second doped semiconductor film with the wiring serving as a mask.

In such a method of manufacturing a semiconductor device of the present invention, the first gate insulating film, the first non-doped semiconductor film, and the first doped semiconductor film having the one of n-type and p-type conductivity are formed successively.

In such a method of manufacturing a semiconductor device of the present invention, the second gate insulating film, the second non-doped semiconductor film, and the second doped semiconductor film having the other one of n-type and p-type conductivity are formed successively.

In such a method of manufacturing a semiconductor device of the present invention, the first gate insulating film, the first non-doped semiconductor film, and the first doped semiconductor film having the one of n-type and p-type conductivity are formed successively, and the second gate insulating film, the second non-doped semiconductor film, and the second doped semiconductor film having the other one of n-type and p-type conductivity are formed successively.

In such a method of manufacturing a semiconductor device of the present invention, a part of the first doped semiconductor film overlaps with the first gate electrode and a part of the second doped semiconductor film overlaps with the second gate electrode.

In such a method of manufacturing a semiconductor device of the present invention, the substrate is formed of a resin material.

In such a method of manufacturing a semiconductor device of the present invention, the first non-doped semiconductor film and the second non-doped semiconductor film are amorphous semiconductor films or amorphous semiconductor films including microcrystals.

Another aspect of the present invention is a semiconductor device which includes a first thin film transistor having a first gate electrode, a first gate insulating film formed over the first gate electrode, a first non-doped semiconductor layer formed over the first gate insulating film, and a first doped semiconductor layer formed over the first non-doped semiconductor layer; and a second thin film transistor having a second gate electrode, a second gate insulating film formed over the second gate electrode, a second non-doped semiconductor layer formed over the second gate insulating film, and a second doped semiconductor layer formed over the second non-doped semiconductor layer. In such a semiconductor device, the first thin film transistor has opposite conductivity to the second thin film transistor, and a thickness of the first gate insulating film is different from a thickness of the second gate insulating film.

In such a semiconductor device of the present invention, the first thin film transistor is an n-type thin film transistor and the second thin film transistor is a p-type thin film transistor, and the thickness of the first gate insulating film is larger than the thickness of the second gate insulating film.

In such a semiconductor device of the present invention, the first thin film transistor is located in a pixel portion and the second thin film transistor is located in a peripheral circuit portion.

Another aspect of the present invention is a semiconductor device which includes a first thin film transistor having a first gate electrode, a first gate insulating film formed over the first gate electrode, a first non-doped semiconductor layer formed over the first gate insulating film, and a first doped semiconductor layer formed over the first non-doped semiconductor layer; a second thin film transistor having a second gate electrode, a second gate insulating film formed over the second gate electrode, a second non-doped semiconductor layer formed over the second gate insulating film, and a second doped semiconductor layer formed over the second non-doped semiconductor layer; and a third thin film transistor having a third gate electrode, a third gate insulating film formed over the third gate electrode, a third non-doped semiconductor layer formed over the third gate insulating film, and a third doped semiconductor layer formed over the third non-doped semiconductor layer. In such a semiconductor device, the first thin film transistor and the second thin film transistor are n-channel thin film transistors while the third thin film transistor is a p-channel thin film transistor, and a thickness of the first gate insulating film is larger than a thickness of the third gate insulating film and a thickness of the second gate insulating film is larger than a thickness of the third gate insulating film.

In such a semiconductor device of the present invention, the first thin film transistor is located in a pixel portion and the second thin film transistor and the third thin film transistor are located in a peripheral circuit portion.

Another aspect of the present invention is a semiconductor device which includes a first thin film transistor having a first gate electrode, a first gate insulating film formed over the first gate electrode, a first non-doped semiconductor layer formed over the first gate insulating film, and a first doped semiconductor layer formed over the first non-doped semiconductor layer; a second thin film transistor having a second gate electrode, a second gate insulating film formed over the second gate electrode, a second non-doped semiconductor layer formed over the second gate insulating film, and a second doped semiconductor layer formed over the second non-doped semiconductor layer; a third thin film transistor having a third gate electrode, a third gate insulating film formed over the third gate electrode, a third non-doped semiconductor layer formed over the third gate insulating film, and a third doped semiconductor layer formed over the third non-doped semiconductor layer; and a storage capacitor having a fourth gate electrode, a fourth gate insulating film formed over the fourth gate electrode, a fourth non-doped semiconductor layer formed over the fourth gate insulating film, and a fourth doped semiconductor layer formed over the fourth non-doped semiconductor layer. In such a semiconductor device, the first thin film transistor and the second thin film transistor are n-channel thin film transistors while the third thin film transistor is a p-channel thin film transistor, and a thickness of the first gate insulating film is larger than a thickness of the third gate insulating film and is larger than a thickness of the fourth gate insulating film, and a thickness of the second gate insulating film is larger than the thickness of the third gate insulating film and is larger than the thickness of the fourth gate insulating film.

In such a semiconductor device of the present invention, the first thin film transistor and the storage capacitor are located in a pixel portion, the second thin film transistor and the third thin film transistor are located in a peripheral circuit portion, and the storage capacitor is electrically connected to the first thin film transistor.

Another aspect of the present invention is a method of manufacturing a semiconductor device, which includes forming a first gate electrode and a second gate electrode; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film to form a first island-shaped semiconductor layer in which a first non-doped semiconductor layer and a first doped semiconductor layer are stacked in that order over the first gate electrode, and to expose the first gate insulating film which is over the second gate electrode; removing the exposed first gate insulating film to expose the second gate electrode; forming a second gate insulating film, a second non-doped semiconductor film, and a second doped semiconductor film having the other one of n-type and p-type conductivity in that order over the exposed second gate electrode and the first island-shaped semiconductor layer; removing the second non-doped semiconductor film and the second doped semiconductor film by a first etching to form a second island-shaped semiconductor layer in which a second non-doped semiconductor layer and a second doped semiconductor layer are stacked in that order over the second gate electrode, and to expose the second gate insulating film which is over the first island-shaped semiconductor layer; removing the exposed second gate insulating film by a second etching, to expose the first island-shaped semiconductor layer; forming a wiring over the first island-shaped semiconductor layer and the second island-shaped semiconductor layer; and partially removing the first doped semiconductor film and the second doped semiconductor film with the wiring serving as a mask.

Another aspect of the present invention is a method of manufacturing a semiconductor device, which includes forming a first gate electrode and a second gate electrode; forming a first gate insulating film, a first non-doped semiconductor film, and a first doped semiconductor film having one of n-type and p-type conductivity in that order over the first gate electrode and the second gate electrode; removing the first non-doped semiconductor film and the first doped semiconductor film to form a first island-shaped semiconductor layer in which a first non-doped semiconductor layer and a first doped semiconductor layer are stacked in that order over the first gate electrode, and to expose the first gate insulating film over the second gate electrode; forming a second gate insulating film, a second non-doped semiconductor film, and a second doped semiconductor film having the other one of n-type and p-type conductivity in that order over the exposed first gate insulating film and the first island-shaped semiconductor layer; removing the second non-doped semiconductor film and the second doped semiconductor film by a first etching to form a second island-shaped semiconductor layer in which a second non-doped semiconductor layer and a second doped semiconductor layer are stacked in that order over the second gate electrode, and to expose the second gate insulating film over the first island-shaped semiconductor layer; removing the exposed second gate insulating film by a second etching, to expose the first island-shaped semiconductor layer; forming a wiring over the first island-shaped semiconductor layer and the second island-shaped semiconductor layer; and partially removing the first doped semiconductor film and the second doped semiconductor film with the wiring serving as a mask.

In such a method of manufacturing a semiconductor device of the present invention, the first etching is conducted using conditions in which the etching rate of the second gate insulating film is lower than the etching rate of the second non-doped semiconductor film, and the second etching is conducted using condition in which the etching rate of the first doped semiconductor layer is lower than the etching rate of the second gate insulating film.

In such a method of manufacturing a semiconductor device of the present invention, the first gate insulating film, the first non-doped semiconductor film, and the first doped semiconductor film are formed successively, and the second gate insulating film, the second non-doped semiconductor film, and the second doped semiconductor film are formed successively.

In such a method of manufacturing a semiconductor device of the present invention, the first non-doped semiconductor film and the second non-doped semiconductor film are amorphous semiconductor films or amorphous semiconductor films including microcrystals.

Since semiconductor layers of both n-type and p-type thin film transistors have parts in which a non-doped semiconductor layer and a doped semiconductor layer are stacked in that order, a structure which does not require heating treatment can be realized; therefore, variation among TFTs in a semiconductor device including NTFTs and PTFTs can be reduced, and in addition, the number of masks, the number of manufacturing steps, and manufacturing time can be reduced.

When a gate insulating film of one of an NTFT and a PTFT serves as a protection film (an etching stopper film) for a semiconductor layer of the other one of the NTFT and the PTFT, advantageous effects of reducing variation among TFTs, reducing the number of masks and manufacturing steps, and reducing manufacturing time can be further enhanced.

When a gate insulating film, a non-doped semiconductor layer, and a doped semiconductor layer are formed successively in each n-type thin film transistor and p-type thin film transistor, advantageous effects of reducing variation among TFTs, reducing the number of masks and manufacturing steps, and reducing manufacturing time can be further enhanced.

BRIEF DESCRIPTION OF THE DRAWINGS

FIGS. 15A to 15C are cross-sectional views of a method of manufacturing a semiconductor device (Embodiment Mode 7);

FIGS. 16A to 16C are cross-sectional views of a method of manufacturing a semiconductor device (Embodiment Mode 7);

DETAILED DESCRIPTION OF THE INVENTION

Figure 1A:
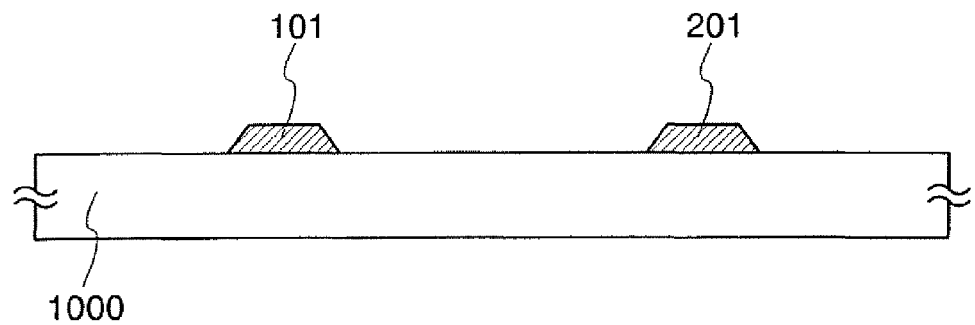
FIGS. 1A to 1C are cross-sectional views of a method of manufacturing a semiconductor device (Embodiment Mode 1)

Hereinafter, embodiment modes of the present invention are described with reference to the accompanying drawings. Note that the present invention can be implemented in many different modes and it will be readily appreciated by those skilled in the art that modes and details can be modified in various ways without departing from the spirit and scope of the present invention. Accordingly, the present invention should not be construed as being limited to the description of the embodiment modes given below.

Note that following Embodiment Modes 1 to 10 can be combined as appropriate. Further, in the drawings, portions which are denoted by the same reference numerals can be formed of the same materials by the same methods, unless otherwise specified.

[Embodiment Mode 1]

In this embodiment mode, a method of manufacturing a semiconductor device of the present invention is described. Note that although a semiconductor device such as an active matrix display device, a central processing unit (a CPU), or a wireless chip (an RFID chip) includes a plurality of NTFTs and a plurality of PTFTs formed over a substrate, for convenience, two TFTs, a NTFT and a PTFT, are described with reference to the drawings in this embodiment mode.

A first gate electrode 101 and a second gate electrode 201 are formed over a substrate 1000 having an insulating surface (see FIG. 1A). The first gate electrode 101 and the second gate electrode 201 are formed as follows: a conductive film is formed, a mask is formed, etching is conducted, and then the mask is removed.

The first gate electrode 101 serves as a gate electrode of one of an NTFT and a PTFT, while the second gate electrode 201 serves as a gate electrode of the other one of the NTFT and the PTFT.

In this embodiment mode, the first gate electrode 101 is a gate electrode of the NTFT and the second gate electrode 201 is a gate electrode of the PTFT.

Figure 1B:
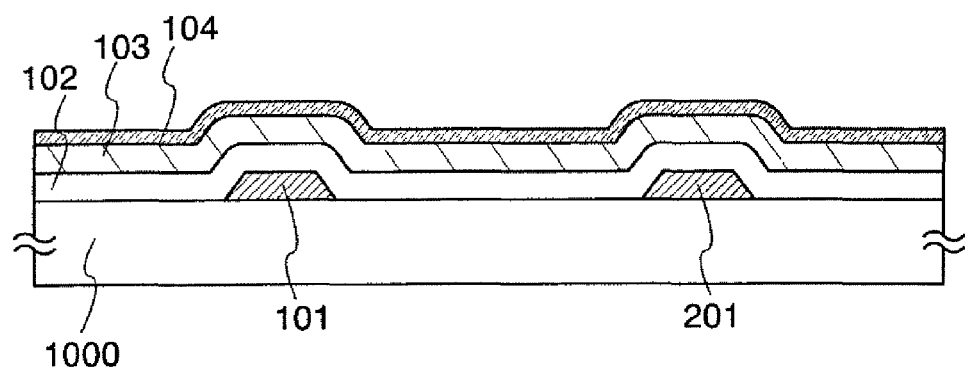

Then, a first gate insulating film 102, a first non-doped semiconductor film 103, and a first doped semiconductor film 104 are formed in that order over the first gate electrode 101 and the second gate electrode 201 (see FIG. 1B).

A non-doped semiconductor film refers to a semiconductor film which is formed without using a gas which contains an impurity element which imparts conductivity to a semiconductor as a film-forming gas. A doped semiconductor film refers to a semiconductor film which is formed using a gas which contains an impurity element which imparts conductivity as a film-forming gas.

The first doped semiconductor film 104 is one of an n-type impurity semiconductor film and a p-type impurity semiconductor film. In this embodiment mode, the first doped semiconductor film 104 is an n-type impurity semiconductor film.

Here, it is highly preferable to form the first gate insulating film, the first non-doped semiconductor film, and the first doped semiconductor film successively.

To form films successively means to successively form a plurality of films which are stacked over a substrate without the substrate being exposed to an outside atmosphere, within one apparatus; that is, to successively stack a plurality of films over a substrate in one apparatus without any of the plurality of films being exposed to an outside atmosphere. When the films are successively formed, pretreatment for film formation such as removal of dust or the like is not necessary; accordingly, the number of manufacturing steps and manufacturing time can be reduced.

In addition, when successive film formation is conducted, electrical characteristics of TFTs are improved, electrical characteristics of TFTs are stabilized, and variation among TFTs can be reduced, as is described below.

First, the technical meaning of successive formation of a gate insulating film and a non-doped semiconductor film is described below.

When the gate insulating film and the non-doped semiconductor film are formed successively, impurities (e.g., particles, phosphorus, boron, or sodium) are prevented from adhering to an interface between the gate insulating film and the non-doped semiconductor film.

Therefore, interface-trap charge at the interface between the gate insulating film and the non-doped semiconductor film caused by the particles, the phosphorus, the boron, or the like can be prevented. Further, contamination by impurities such as sodium is prevented. Accordingly, an interface state can be favorable.

Having a favorable interface state can improve electrical characteristics of TFTs and stabilize electrical characteristics of the TFTs.

Further, since the impurities are mixed into TFTs unevenly, electrical characteristics vary among the TFTs.

When the amount of impurities is reduced, variations in electrical characteristics among the TFTs can be reduced.

In particular, when an amorphous semiconductor is used as the semiconductor, the gate insulating film and the non-doped semiconductor film are preferably formed successively.

This is because since an amorphous semiconductor has lower mobility than a polycrystalline semiconductor or a single crystal semiconductor, easily stop operating if there are defects such as contamination of the interface between the gate insulating film and the non-doped semiconductor film by impurities.

Note that in this specification, an amorphous semiconductor may be a semiconductor including microcrystals.

Second, the technical meaning of successive formation of a non-doped semiconductor film and a doped semiconductor film is described below.

When the non-doped semiconductor film and the doped semiconductor film are formed successively, a natural oxide film can be prevented from forming at an interface between the non-doped semiconductor film and the doped semiconductor film and impurities can be prevented from adhering to a surface of the semiconductor layer, for example.

When a natural oxide film or insulating impurities exist at the interface between the non-doped semiconductor film and the doped semiconductor, contact resistance at the interface between the non-doped semiconductor film and the doped semiconductor may increase.

If the impurities are conductive, leakage current flows.

Since formation of the natural oxide film and contamination by the impurities are uneven, electrical characteristics vary among TFTs.

Accordingly, when formation of the natural oxide film and contamination by the impurities are prevented, variation in electrical characteristics among TFTs can be reduced.

Figure 1C:
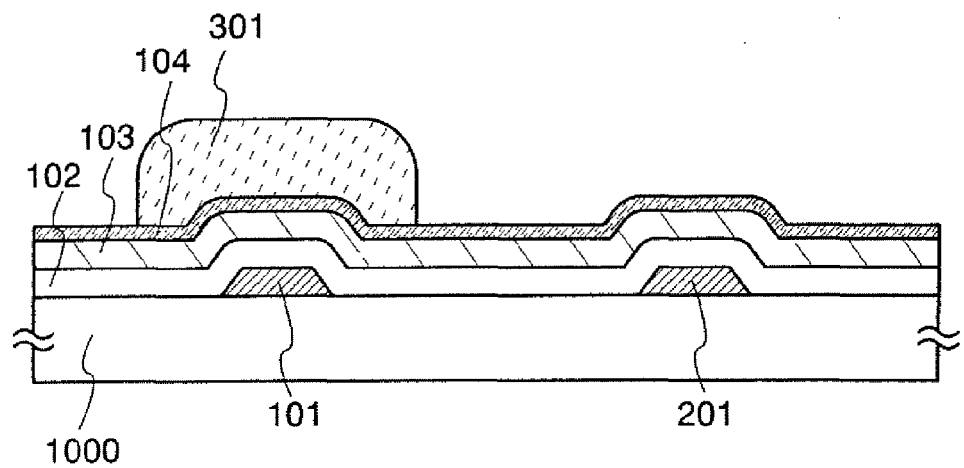

Referring again to the method of manufacturing, a mask 301 is formed over the first doped semiconductor film 104 which is formed over the first gate electrode 101 (see FIG. 1C).

After the mask 301 is formed, a first etching 8001 is conducted in order to form an island-shaped semiconductor layer of the NTFT. By the first etching, the first non-doped semiconductor film 103 and the first doped semiconductor film 104 which are formed over the second gate electrode 201 are entirely removed (see FIG. 2A).

Figure 2A:
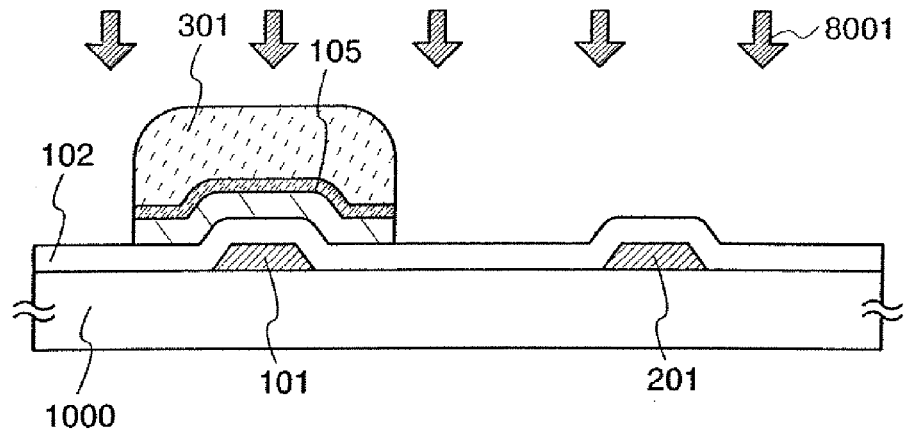
FIGS. 2A to 2C are cross-sectional views of a method of manufacturing a semiconductor device (Embodiment Mode 1)

Accordingly, by the first etching, the first gate insulating film 102 is exposed and a first island-shaped semiconductor layer 105 is formed in which a non-doped semiconductor layer and a doped semiconductor layer are stacked (see FIG. 2A).

Thus, in the first etching, the first gate insulating film 102 serves as an etching stopper film (see FIG. 2A).

Then, a second etching 8002 is conducted using etching conditions different from those of the first etching. By the second etching, the first gate insulating film which is formed over the second gate electrode 201 is removed (see FIG. 2B).

A two-step etching is conducted because when the first gate insulating film 102 which is formed over the second gate electrode 201 serves as an etching stopper, damage to the second gate electrode 201 can be prevented.

Here, damage refers to, for example, reduction in thickness or size of the second gate electrode or formation of a large difference in level on a surface of the second gate electrode due to etching of the second gate electrode 201. In the case of conducting dry etching, electrical damage by plasma also occurs.

Therefore, the first etching employs conditions in which the etching rate of the first gate insulating film is lower than that of the non-doped semiconductor film. On the other hand, the second etching employs conditions in which the etching rate of the second gate electrode is lower than that of the first gate insulating film.

In other words, the first and second etchings are conducted using conditions in which the etching rate of a lower film is lower than that of an upper film. Note that the lower the etching rate of the lower film, the better.

In conditions in which the etching rate of the non-doped semiconductor film is high, the etching rate of the doped semiconductor film is also high; therefore, a stack-layer structure of the non-doped semiconductor film and the doped semiconductor film can be etched collectively.

Note that an etching of the stack-layer structure (the first etching) may have plural stages.

Figure 2B:
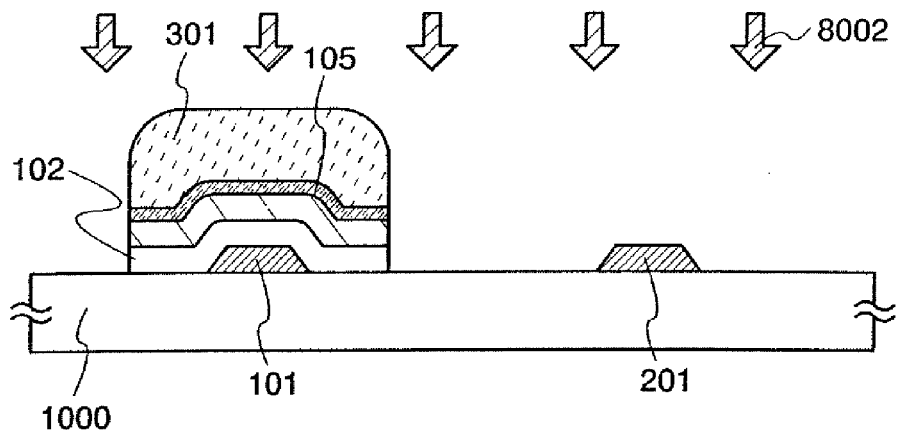
Figure 2C:
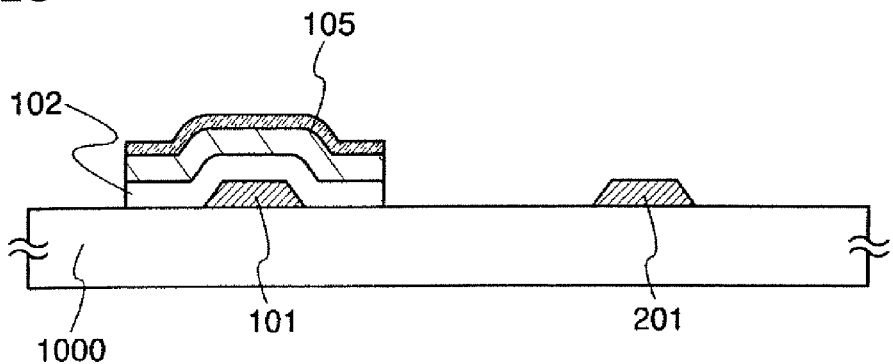

After the second etching, the mask is removed (see FIG. 2C).

Figure 3A:
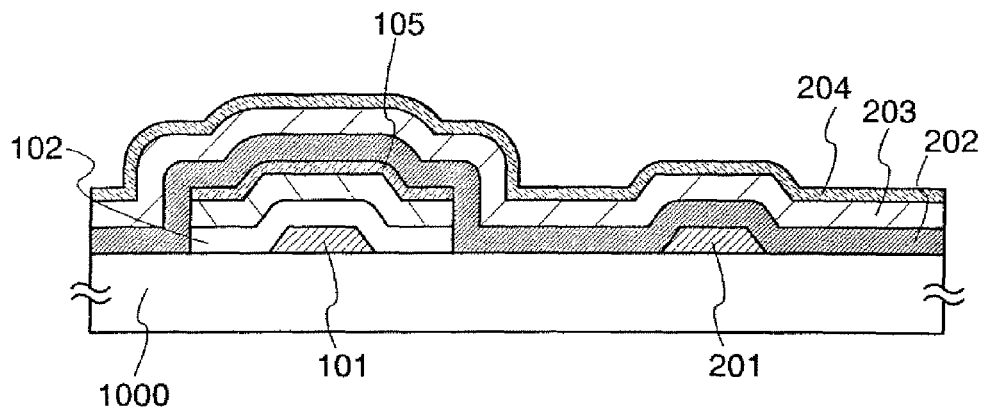
FIGS. 3A to 3C are cross-sectional views of a method of manufacturing a semiconductor device (Embodiment Mode 1)

Then, a second gate insulating film 202, a second non-doped semiconductor film 203, and a second doped semiconductor film 204 are stacked in that order over the first island-shaped semiconductor layer 105 and the second gate electrode 201 (see FIG. 3A).

As described above, it is highly preferable to form the second gate insulating film, the second non-doped semiconductor film, and the second doped semiconductor film successively.

Figure 3B:
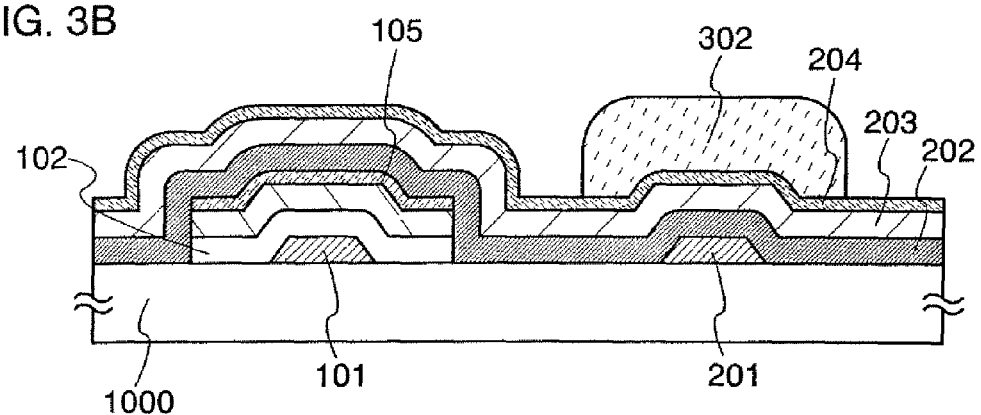

Then, a mask 302 is formed over the second doped semiconductor film 204 which is over the second gate electrode 201 (see FIG. 3B).

After the mask is formed, a third etching 8003 is conducted in order to form an island-shaped semiconductor layer of the PTFT. By the third etching, the second non-doped semiconductor film 203 and the second doped semiconductor film 204 which are formed over the first gate electrode 101 are entirely removed (see FIG. 3C).

Figure 3C:
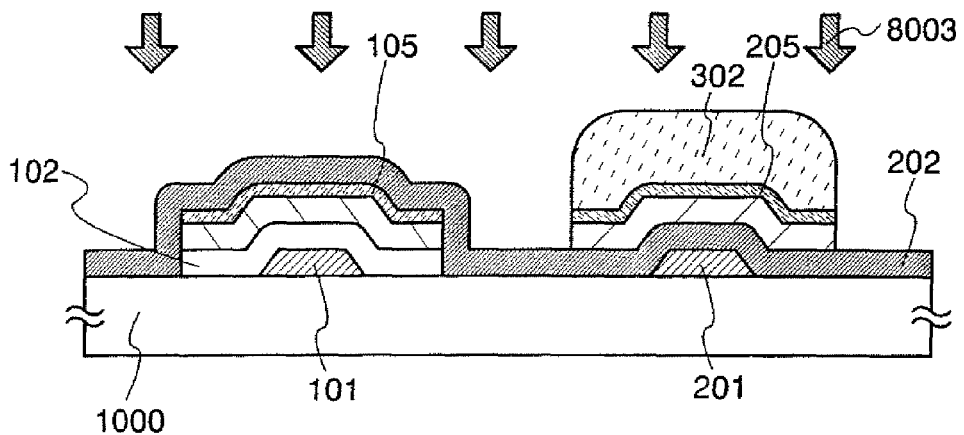

Accordingly, by the third etching, the second gate insulating film 202 is exposed and a second island-shaped semiconductor layer 205 is formed in which a non-doped semiconductor layer and a doped semiconductor layer are stacked (see FIG. 3C).

Thus, in the third etching, the second gate insulating film 202 serves as an etching stopper film.

Then, a fourth etching 8004 is conducted using etching conditions different from those of the third etching without removing the mask. By the fourth etching, the second gate insulating film 202 which is formed over the first island-shaped semiconductor layer 105 is removed (see FIG. 4A).

A two-step etching is conducted because when the second gate insulating film 202 which is formed over the first island-shaped semiconductor layer 105 serves as an etching stopper, damage to the first island-shaped semiconductor layer 105 can be prevented.

Here, damage refers to, for example, reduction in thickness or size of the first island-shaped semiconductor layer due to etching of the first island-shaped semiconductor layer due to etching of the first island-shaped semiconductor layer. In the case of conducting dry etching, electrical damage by plasma also occurs.

Therefore, the third etching employs conditions in which the etching rate of the second gate insulating film is lower than that of the non-doped semiconductor film. On the other hand, the fourth etching employs conditions in which the etching rate of the doped semiconductor film is lower than that of the second gate insulating film.

In other words, the third and fourth etchings are conducted using conditions in which the etching rate of a lower film is lower than that of an upper film. Note that the lower the etching rate of the lower film, the better.

In conditions in which the etching rate of the non-doped semiconductor film is high, the etching rate of the doped semiconductor film is also high; therefore, a stack-layer structure of the non-doped semiconductor film and the doped semiconductor film can be etched collectively.

Note that an etching of the stack-layer structure (the third etching) may have plural stages.

Figure 4A:
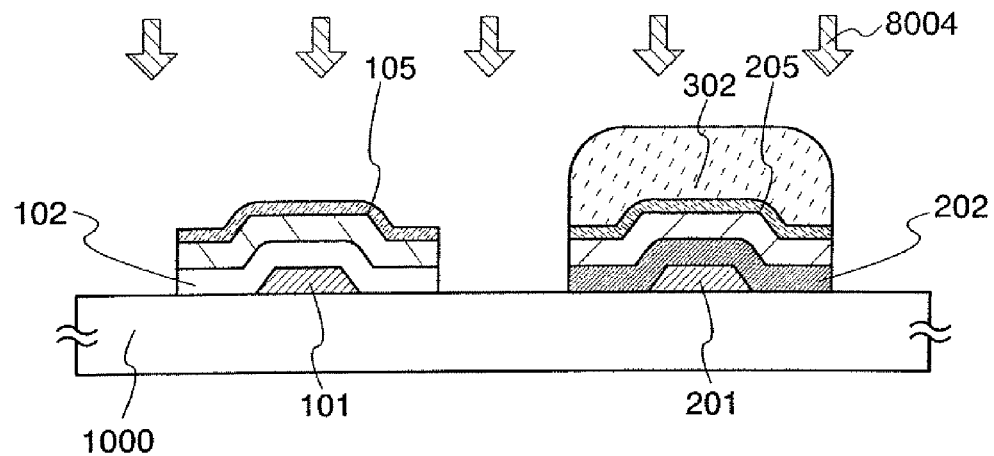
FIGS. 4A to 4C are cross-sectional views of a method of manufacturing a semiconductor device (Embodiment Mode 1)
Figure 4B:
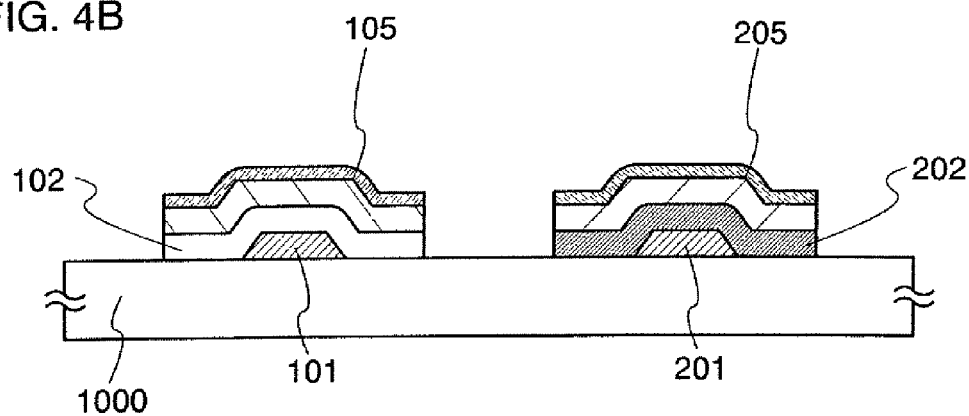

After the fourth etching, the mask is removed (see FIG. 4B).

As described above, the gate insulating film of one of the NTFT and the PTFT serves as a protection film (an etching stopper film) for an island-shaped semiconductor layer of the other one of the NTFT and the PTFT; accordingly, the number of mask formations can be reduced in the case of forming both NTFTs and PTFTs. In addition, since damage to the island-shaped semiconductor layer of the other one of the NTFT and the PTFT can be prevented, variations in electrical characteristics among TFTs can be reduced.

Further, since the gate insulating film serves as the protection film (the etching stopper film), a semiconductor layer containing an impurity element which imparts conductivity can be formed both in the NTFT and the PTFT. That is, the doped semiconductor film can be used both in the NTFT and the PTFT.

Further, since the doped semiconductor film is used in both in the NTFT and the PTFT, the gate insulating film, the non-doped semiconductor film, and the doped semiconductor film can be formed successively in both in the NTFT and the PTFT.

Comparing the case in which the gate insulating film, the non-doped semiconductor film, and the doped semiconductor film are not successively formed in one of the NTFT and the PTFT with the case in which the gate insulating film, the non-doped semiconductor film, and the doped semiconductor film are formed successively both in the NTFT and the PTFT are compared, the latter case has significant advantageous effects of reducing variation among TFTs and is preferable.

Figure 4C:
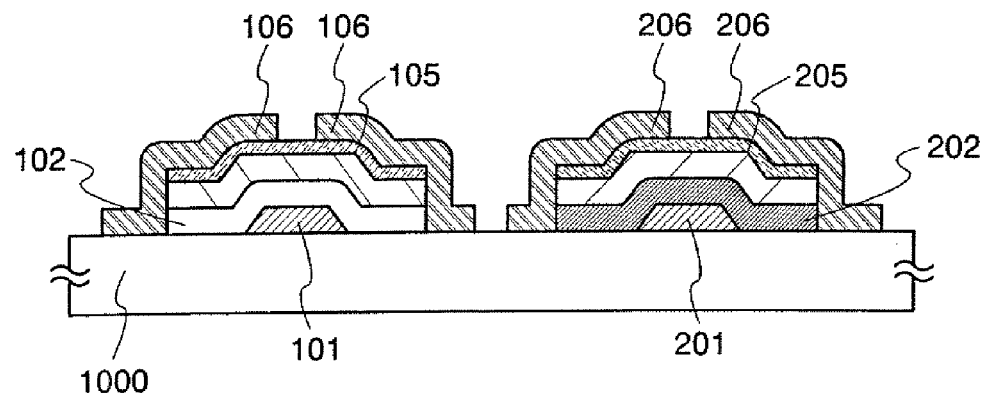

Then, a first wiring 106 and a second wiring 206 are formed over the first island-shaped semiconductor layer 105 and the second island-shaped semiconductor layer 205, respectively, at the same time (see FIG. 4C). The first wiring 106 and the second wiring 206 are formed as follows: a conductive film is formed, a mask is formed, etching is conducted, and then the mask is removed.

Figure 5A:
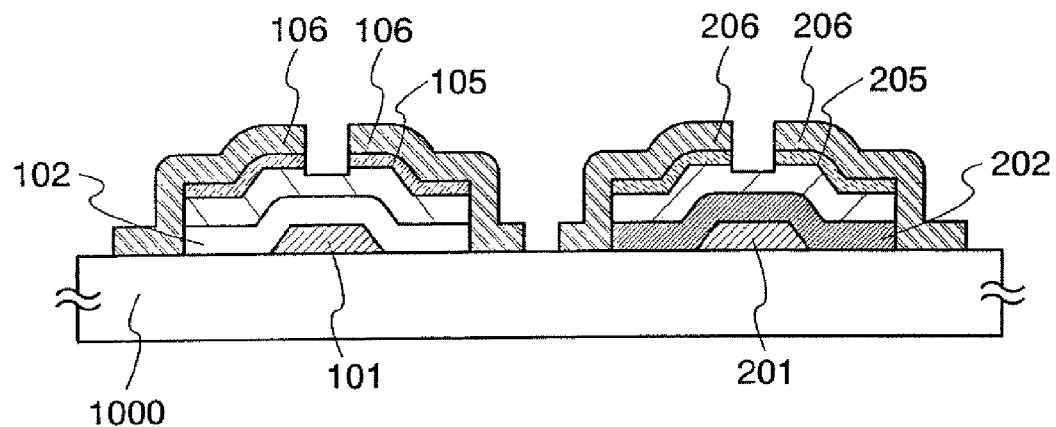
FIGS. 5A to 5C are cross-sectional views of a method of manufacturing a semiconductor device (Embodiment Mode 1)

Then, the doped semiconductor film in an upper layer of the first island-shaped semiconductor layer 105 and the doped semiconductor film in an upper layer of the second island-shaped semiconductor layer 205 are etched with the first wiring 106 and the second wiring 206 serving as a mask (see FIG. 5A). By this step, channel formation regions, source regions, and drain regions are determined (formed) in the first island-shaped semiconductor layer 105 and the second island-shaped semiconductor layer 205.

In this etching, the non-doped semiconductor layer which serves as a channel formation region is slightly etched. A TFT formed in this manner is referred to as a channel-etch type TFT (thin film transistor).

Figure 5B:
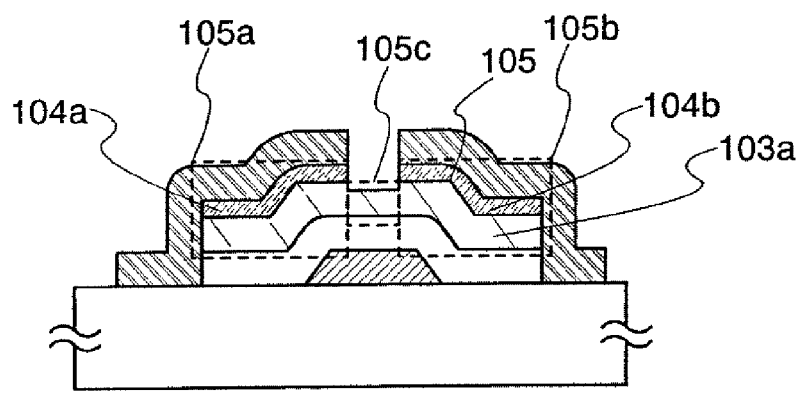

FIG. 5B is an enlarged view of the NTFT in FIG. 5A.

In FIG. 5B, a channel formation region in the first island-shaped semiconductor layer 105 is a region denoted by 105c.

One of a first source region and a first drain region in the first island-shaped semiconductor layer 105 is a region denoted by 105a (see FIG. 5B).

The other one of the first source region and the first drain region in the first island-shaped semiconductor layer 105 is a region denoted by 105b (see FIG. 5B).

The first island-shaped semiconductor layer 105 has a structure in which a doped semiconductor layer 104a formed in the region denoted by 105a, which is one of the first source region and the first drain region, and a doped semiconductor layer 104b formed in the region denoted by 105b, which is the other one of the first source region and the first drain region, are stacked over a non-doped island-shaped semiconductor layer 103a (see FIG. 5B).

Figure 5C:
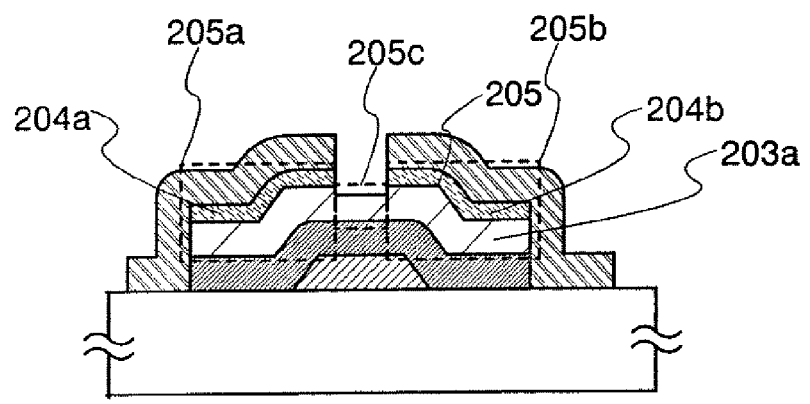

FIG. 5C is an enlarged view of the PTFT in FIG. 5A.

In FIG. 5C, a channel formation region in the second island-shaped semiconductor layer 205 is a region denoted by 205c.

One of a second source region and a second drain region in the second island-shaped semiconductor layer 205 is a region denoted by 205a (see FIG. 5C).

The other one of the second source region and the second drain region in the second island-shaped semiconductor layer 205 is a region denoted by 205b (see FIG. 5C).

The second island-shaped semiconductor layer 205 has a structure in which a doped semiconductor layer 204a formed in the region denoted by 205a, which is one of the second source region and the second drain region, and a doped semiconductor layer 204b formed in the region denoted by 205b, which is the other one of the second source region and the second drain region, are stacked over a non-doped island-shaped semiconductor layer 203a (see FIG. 5C).

Subsequently, a pixel electrode which is electrically connected to one of the NTFT and the PTFT is formed. Whether the pixel electrode is electrically connected to the NTFT or to the PTFT can be selected as appropriate by those skilled in the art depending on a type of a display device, a circuit structure, or the like. For example, in the case of a liquid crystal display device, it is preferable to electrically connect the pixel electrode to the NTFT, while in the case of an EL display device, it is preferable to electrically connect the pixel electrode to the PTFT. In this embodiment mode, the pixel electrode is electrically connected to the first wiring 106.

Note that in the case of manufacturing a reflective display device, the pixel electrode may be formed at the same time as the first wiring 106 and the second wiring 206.

Then, after an interlayer insulating film is formed, a display element is formed.

For example, in the case of a liquid crystal display device, a counter substrate provided with a counter electrode, a color filter, and the like is prepared. Then, alignment films are formed on the counter substrate and the substrate provided with TFTs. After the substrate provided with TFTs and the counter substrate are attached to each other with a sealant, liquid crystal is injected between the substrate provided with TFTs and the counter substrate. In this case, a display element is a part in which the pixel electrode, the liquid crystal, and the counter electrode overlap.

For example, in the case of an EL display device, a layer including a light emitting layer is formed over the pixel electrode and an electrode is formed over the layer including the light emitting layer. Then, a counter substrate is prepared, and the counter substrate and a substrate provided with TFTs are attached to each other with a sealant. In this case, a display element is a part in which the pixel electrode, the layer including the light emitting layer, and the electrode overlap.

By using a method of manufacturing a semiconductor device of this embodiment mode, a semiconductor device including TFTs whose electrical characteristics are stable and have less variation can be provided with reduced numbers of manufacturing steps and masks, and reduced manufacturing time.

In addition, in this embodiment mode, when the thickness of the first gate insulating film 102 at the time of formation and the thickness of the second gate insulating film 202 at the time of formation are different, the thickness of the NTFT and the thickness of the PTFT can be different.

[Embodiment Mode 2]

As described in Embodiment Mode 1, in the third and fourth etchings, it is very important to also use the second gate insulating film 202 as a protection film (an etching stopper film) for the first island-shaped semiconductor layer 105. In this embodiment mode, detailed description of this point is made.

First, in the case of conducting wet etching, the etching rate of a non-doped semiconductor film and the etching rate of a doped semiconductor film are almost equal.

A difference between the etching rate of the non-doped semiconductor film and the etching rate of the doped semiconductor film in the case of conducting dry etching is described below. As an etching gas for dry etching of the semiconductor film, a gas containing a halogen element (e.g., F or Cl) is suitable.

In the case of conducting dry etching using a gas containing a halogen element, the etching rate of an n-type doped semiconductor film is considerably higher than that of the non-doped semiconductor film. On the other hand, the etching rate of a p-type doped semiconductor film is slightly lower than that of the non-doped semiconductor film.

The etching rates of doped semiconductor films change depending on the impurity contained in the doped semiconductor films because of the electrical characteristics of the semiconductor films. The etching rate of the n-type semiconductor is high because many electrons in the semiconductor lattice contribute to an etching reaction.

Based on the above, the case in which the second gate insulating film 202 is not used as the protection film (the etching stopper film) for the first island-shaped semiconductor layer 105 in the third and fourth etchings is described below. Description is made separately for each type of etching and each conductivity type of a doped semiconductor film in an upper layer of the first island-shaped semiconductor layer 105.

In the case of conducting wet etching, if the second gate insulating film 202 (the etching stopper film) is not provided between the first doped semiconductor film 104 and the second non-doped semiconductor film 203, since the etching rates of the films are almost equal, it is difficult to stop etching at the upper surface of the first doped semiconductor film 104.

In the case where dry etching is conducted using a gas containing a halogen element and the first doped semiconductor film 104 is an n-type semiconductor film, if the second gate insulating film 202 (the etching stopper film) is not provided between the first doped semiconductor film 104 and the second non-doped semiconductor film 203, since the etching rate of the first doped semiconductor film 104, which is the lower layer, is considerably higher than the etching rate of the second non-doped semiconductor film 203, which is the upper layer, it is difficult to stop etching at the upper surface of the first doped semiconductor film 104.

In the case where dry etching is conducted using a gas containing a halogen element and the first doped semiconductor film 104 is a p-type semiconductor film, if the second gate insulating film 202 (the etching stopper film) is not provided between the first doped semiconductor film 104 and the second non-doped semiconductor film 203, it is difficult to stop etching at the upper surface of the first doped semiconductor film 104.

As described above, in order to prevent etching damage to the first island-shaped semiconductor layer 105, it is very important to use the second gate insulating film 202 as the protection film (the etching stopper film) for the first island-shaped semiconductor layer 105.

[Embodiment Mode 3]

In this embodiment mode, a material of the semiconductor device which is mentioned in Embodiment Modes 1 and 2 is described.

As to the substrate 1000 having an insulating surface, an insulating substrate can be used, such as a glass substrate, a quartz substrate, a resin substrate formed of polyethylene terephthalate (PET), a resin substrate formed of polyethylene naphthalate (PEN), a resin substrate formed of polyether sulfone (PES), or a resin substrate formed of polyimide (see FIG. 1A).

Note that when the method of manufacturing a semiconductor device described in Embodiment Modes 1 and 2 is used, an ion implantation method which needs activation at high temperature (600° C. or higher), a thermal diffusion method which is conducted at high temperature (800° C. or higher), or the like is not required for forming a source region and a drain region. Accordingly, all the steps can be performed at low temperature (300° C. or lower), a TFT can be directly manufactured over a substrate with low heat resistance.

Accordingly, a TFT can be directly manufactured over a resin substrate with low heat resistance. When a flexible resin substrate is used, a flexible semiconductor device can be manufactured.

Further, a substrate having an insulating base film thereon can be used as the substrate 1000 having an insulating surface regardless of the conductivity of the substrate. For example, an insulating substrate having an insulating base film on its surface, or a silicon wafer or a metal substrate which have an insulating base film on a surface can be used.

As an insulating base film, a single layer or stacked layers including any of a silicon oxide film, a silicon nitride film, a resin film, and the like can be used.

A method of forming the first gate electrode 101 and the second gate electrode 201 is described.

First, a conductive film including a single layer or stacked layers of Mo, Cr, Cu, Nd, Al, Al—Nd, Al—Si, Al—Ti, or the like is formed by a sputtering method or the like. Then, patterning is conducted using a resist mask. Then, the conductive film is etched to form the first gate electrode 101 and the second gate electrode 201. After the etching, the resist mask is removed.

In the case of using a droplet discharging method, the first gate electrode 101 and the second gate electrode 201 are directly deposited over the substrate 1000 having an insulating surface. Note that in the case of using a sputtering method or a droplet discharging method, the gate electrodes can be formed at low temperature (200° C. or lower). The thickness of the gate electrodes is preferably 100 nm to 300 nm (see FIG. 1A).

Formation of the first gate insulating film 102 and the second gate insulating film 202 is described. The gate insulating films can be a silicon nitride film, a silicon oxide film, a silicon nitride oxide film in which nitrogen concentration is higher than oxygen concentration, a silicon oxynitride film in which oxygen concentration is higher than nitrogen concentration, or the like. As a forming method, a CVD method, a sputtering method, or the like can be used. The gate insulating film may have a stack-layer structure.

Note that when the gate insulating film has a stack-layer structure including different kinds of films, the gate insulating film can be more effective as an etching stopper.

When the non-doped semiconductor film and the doped semiconductor film are formed of a material whose main component is silicon by a plasma CVD method, it is preferable that the gate insulating film is also formed of a material whose main component is silicon by a plasma CVD method. Thus, the gate insulating film, a non-doped semiconductor film, and a doped semiconductor film can be formed successively (successive film formation is possible) in one plasma CVD apparatus. The thickness of the gate insulating film is preferably 200 to 500 nm (see FIGS. 1B and 3A).

A method of forming the first non-doped semiconductor film 103 and the second non-doped semiconductor film 203 is described.

As a material of the non-doped semiconductor film, silicon, silicon germanium, or the like is used. A forming method can be a CVD method, a sputtering method, or the like. In the formation, a doping source which imparts n-type or p-type conductivity is not used for a film-forming gas. In the case of a CVD method, the non-doped semiconductor film is formed using a film-forming gas which is a semiconductor source, such as monosilane ($SiH_4$), silicon tetrachloride ($SiCl_4$), trichlorosilane ($SiHCl_3$), or dichlorosilane ($SiH_2Cl_2$). The thickness of the non-doped semiconductor film is 100 to 300 nm (see FIGS. 1B and 3A).

An amorphous semiconductor and a semiconductor including microcrystals are particularly favorable since they can be formed at a temperature as low as 300° C. or lower. In addition, an amorphous semiconductor and a semiconductor including microcrystals are favorable because they can be manufactured in mass production with high productivity. Further, a film of an amorphous semiconductor and a semiconductor including microcrystals are favorable because they can be formed evenly when the size of a substrate is increased. Note that the non-doped semiconductor film is not necessarily a semiconductor film having a single layer structure, and may have a structure in which a plurality of semiconductor films are stacked.

A method of forming the first doped semiconductor film 104 and the second doped semiconductor film 204 is described.

One of the first doped semiconductor film 104 and the second doped semiconductor film 204 is an n-type doped semiconductor film. The other one of the first doped semiconductor film 104 and the second doped semiconductor film 204 is a p-type doped semiconductor film (see FIGS. 1B and 3A).

An n-type doped semiconductor film is formed using a film-forming gas which is a semiconductor source and a film-forming gas which is a doping source which imparts n-type conductivity, by a CVD method. As a film-forming gas which is a semiconductor source, monosilane ($SiH_4$), disilane ($Si_2H_6$), or the like can be used. As a film-forming gas which is a doping source which imparts n-type conductivity, phosphine ($PH_3$), arsine ($AsH_3$), or the like can be used. When a film-forming gas which is a doping source is used to form the n-type doped semiconductor film, the n-type semiconductor film having low resistance can be formed at low temperature. The thickness of the n-type doped semiconductor film is 100 to 200 nm.

A p-type doped semiconductor film is formed using a film-forming gas which is a semiconductor source and a film-forming gas which is a doping source which imparts p-type conductivity, by a CVD method. As a film-forming gas which is a semiconductor source, monosilane ($SiH_4$), disilane ($Si_2H_6$) or the like can be used. As a film-forming gas which is a doping source which imparts p-type conductivity, diborane ($B_2H_6$), or the like can be used. When a film-forming gas which is a doping source is used to form the p-type doped semiconductor film, the p-type semiconductor film having low resistance can be formed at low temperature. The thickness of the p-type doped semiconductor film is 100 to 200 nm.

A method of forming the first wiring 106 and the second wiring 206 is described.

First, a conductive film including a single layer or stacked layers of Mo, Cr, Cu, Nd, Al, Al—Nd, Al—Si, or Al—Ti is formed by a sputtering method or the like. Then, patterning is conducted using a resist mask. Then, the conductive film is etched to form the first wiring 106 and the second wiring 206. After the etching, the resist mask is removed. The thickness of the wirings is preferably 100 to 300 nm (see FIG. 4C).

A method of forming a pixel electrode which is connected to one of an NTFT and a PTFT is described. First, a transparent conductive film of indium tin oxide (hereinafter referred to as ITO), indium tin oxide containing Si elements (hereinafter, referred to as ITSO), IZO (indium zinc oxide) in which zinc oxide (ZnO) is mixed in indium oxide at 2 to 20 wt %, or the like is formed by, for example, a sputtering method. Then, patterning is conducted using a resist mask. Then, the conductive film is etched to form the pixel electrode. After the etching, the resist mask is removed. The thickness of the pixel electrode is preferably 50 to 200 nm.

A method of forming an interlayer insulating film is described.

The interlayer insulating film can be a silicon nitride film, a silicon oxide film, a silicon nitride oxide film in which nitrogen concentration is higher than oxygen concentration, a silicon oxynitride film in which oxygen concentration is higher than nitrogen concentration, or the like. Alternatively, an organic resin film of acrylic, polyimide, a siloxane polymer, or the like can be used.

The following is a description of conditions for the first etching in the case where the materials described in this embodiment mode are used for the gate insulating film, the non-doped semiconductor film, and the doped semiconductor film.

The first etching is conducted in order to remove the first non-doped semiconductor film 103 and the first doped semiconductor film 104 which are formed over the first gate insulating film 102 (see FIG. 2A). Therefore, the first etching is conducted using conditions in which the etching rate of the first non-doped semiconductor film and the first doped semiconductor film is high and the etching rate of the first gate insulating film is low. In the case of conducting dry etching, chlorine ($Cl_2$), a mixed gas of chlorine ($Cl_2$) and oxygen ($O_2$), or the like can be used as an etching gas. Note that although the semiconductor films (i.e., the first doped semiconductor film and the first non-doped semiconductor film) can be etched by $CF_4$, $CF_4$ is not favorable because if $CF_4$ is used, etching selectivity of the semiconductor films to the first gate insulating film is low. In the case of conducting wet etching, an alkaline solution can be used.

The following is a description of conditions for the second etching in the case where the materials described in this embodiment mode are used for the gate insulating film, the non-doped semiconductor film, and the doped semiconductor film.

The second etching is conducted in order to remove the first gate insulating film (the etching stopper film) over the second gate electrode 201 (see FIG. 2B). Therefore, the second etching is conducted using conditions in which the etching rate of the first gate insulating film is high and the etching rate of the second gate electrode is low. In the case of conducting dry etching, $CF_4$, $CHF_3$, a mixed gas of oxygen ($O_2$) and one of $CF_4$ and $CHF_3$, or the like can be used as an etching gas. In the case of conducting wet etching, hydrofluoric acid (HF) or the like can be used.

The following is a description of conditions for the third etching in the case where the materials described in this embodiment mode are used for the gate insulating film, the non-doped semiconductor film, and the doped semiconductor film.

The third etching is conducted in order to remove the second non-doped semiconductor film 203 and the second doped semiconductor film 204 which are formed over the second gate insulating film 202 (see FIG. 3C). Therefore, the third etching is conducted using conditions in which the etching rate of the second non-doped semiconductor film and the second doped semiconductor film is high and the etching rate of the second gate insulating film is low. In the case of conducting dry etching, chlorine ($Cl_2$), a mixed gas of chlorine ($Cl_2$) and oxygen ($O_2$), or the like can be used as an etching gas. Note that although the semiconductor films (i.e., the first doped semiconductor film and the first non-doped semiconductor film) can be etched by $CF_4$, $CF_4$ is not favorable because if $CF_4$ is used, etching selectivity of the semiconductor films to the second gate insulating film is low. In the case of conducting wet etching, an alkaline solution can be used.

The following is a description of conditions for the fourth etching in the case where the materials described in this embodiment mode are used for the gate insulating film, the non-doped semiconductor film, and the doped semiconductor film.

The fourth etching is conducted in order to remove the second gate insulating film (the etching stopper film) over the first doped semiconductor film 104 (see FIG. 4A). Therefore, the fourth etching is conducted using conditions in which the etching rate of the first non-doped semiconductor film and the first doped semiconductor film is high and the etching rate of the second gate electrode is low. In the case of conducting dry etching, it is not favorable to use $CF_4$ alone, because if $CF_4$ is only used, etching selectivity of the second gate insulating film to the semiconductor films (i.e., the first doped semiconductor film and the first non-doped semiconductor film) is low. Note that when hydrogen is mixed into $CF_4$, the etching selectivity is high. Accordingly, a mixed gas of $CF_4$ and hydrogen ($H_2$), $CHF_3$, or the like can be used as an etching gas. In the case of conducting wet etching, hydrofluoric acid (HF) or the like can be used.

[Embodiment Mode 4]

In this embodiment mode, modification examples of Embodiment Modes 1 to 3 are described. While the first gate insulating film 102 over the second gate electrode 201 is entirely removed in Embodiment Mode 1, a structure in which the first gate insulating film 102 over the second gate electrode 201 is not entirely removed is employed in this embodiment mode.

The structure makes it possible to completely prevent damage to the second gate electrode 201 and to purposely vary the thickness of the gate insulating film of the NTFT from that of the gate insulating film of the PTFT. Further, the gate insulating film over the second gate electrode 201 has a stack-layer structure including the first gate insulating film and the second gate insulating film.

Note that portions which are denoted by the same reference numerals as those in Embodiment Modes 1 to 3 can be formed of the materials mentioned in Embodiment Mode 3.

Note that although a semiconductor device such as an active matrix display device, a central processing unit (a CPU), or a wireless chip (an RFID chip), includes a plurality of NTFTs and a plurality of PTFTs formed over a substrate, two TFTs including one NTFT and one PTFT are described with reference to the drawings for convenience in this embodiment mode. Note that in this embodiment mode, a display device is described as an example of semiconductor devices.

Figure 6A:
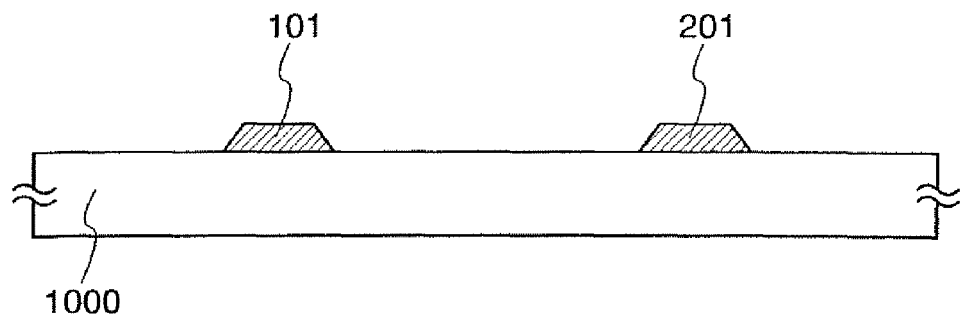
FIGS. 6A to 6C are cross-sectional views of a method of manufacturing a semiconductor device (Embodiment Mode 4)

The first gate electrode 101 and the second gate electrode 201 are formed over the substrate 1000 having an insulting surface (see FIG. 6A). The first gate electrode 101 and the second gate electrode 201 are formed as follows: a conductive film is formed, a mask is formed, etching is conducted, and then the mask is removed.

The first gate electrode 101 serves as a gate electrode of one of an NTFT and a PTFT, while the second gate electrode 201 serves as a gate electrode of the other one of the NTFT and the PTFT.

In this embodiment mode, the first gate electrode 101 is a gate electrode of the NTFT and the second gate electrode 201 is a gate electrode of the PTFT.

Figure 6B:
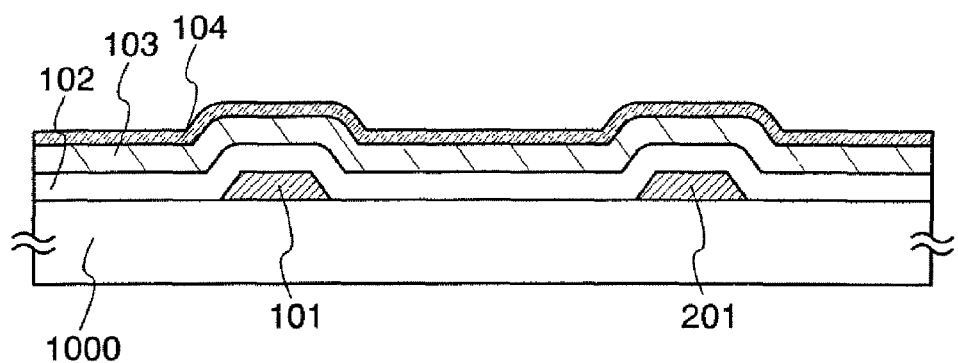

Then, the first gate insulating film 102, the first non-doped semiconductor film 103, and the first doped semiconductor film 104 are formed in that order over the first gate electrode 101 and the second gate electrode 201 (see FIG. 6B). At this time, it is preferable to form the first gate insulating film, the first non-doped semiconductor film, and the first doped semiconductor film successively.

Figure 6C:
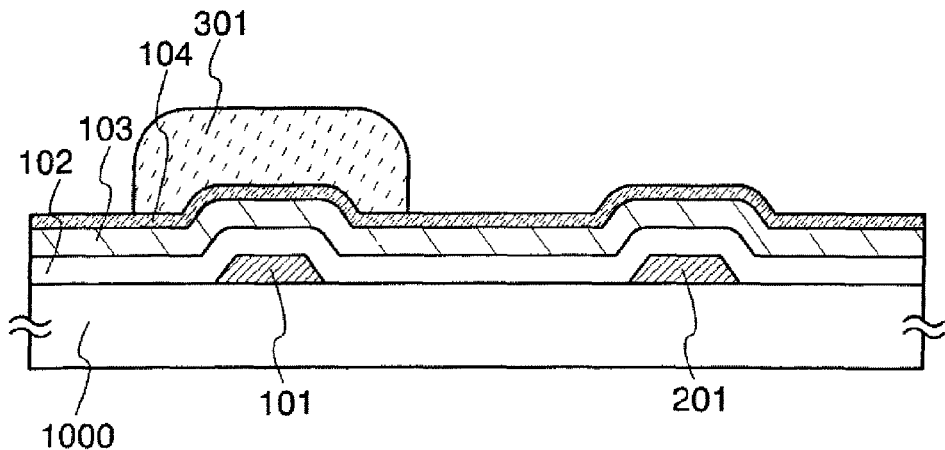

The mask 301 is formed over the first doped semiconductor film 104 which is formed over the first gate electrode 101 (see FIG. 6C).

Figure 7A:
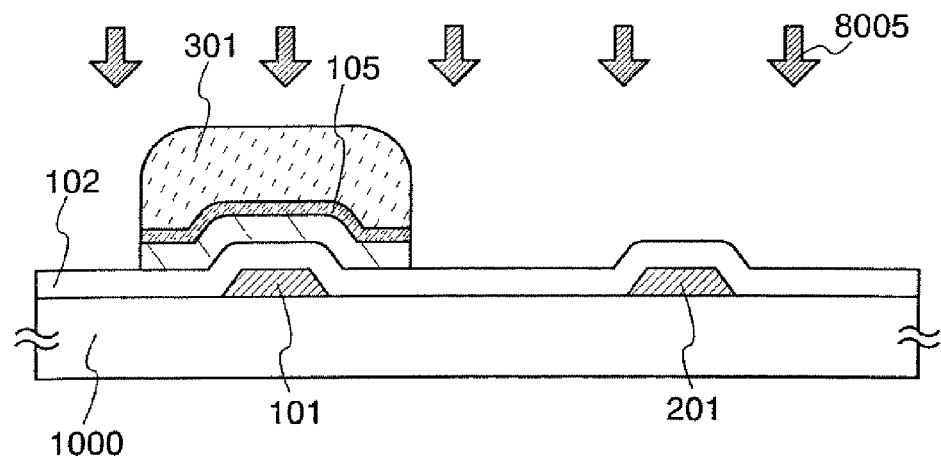
FIGS. 7A to 7C are cross-sectional views of a method of manufacturing a semiconductor device (Embodiment Mode 4)

After the mask 301 is formed, a fifth etching 8005 is conducted in order to form an island-shaped semiconductor layer of the NTFT (see FIG. 7A).

By the fifth etching, the first non-doped semiconductor film 103 and the first doped semiconductor film 104 which are over the second gate electrode 201 are entirely removed. Accordingly, by the fifth etching, the first gate insulating film 102 is exposed and the first island-shaped semiconductor layer 105 is formed in which a non-doped semiconductor layer and a doped semiconductor layer are stacked (see FIG. 7A).

The fifth etching is conducted for removing the first non-doped semiconductor film 103 and the first doped semiconductor film 104 which are formed over the first gate insulating film 102.

Therefore, the fifth etching is conducted using conditions in which the etching rate of the first non-doped semiconductor film and the first doped semiconductor film is high and the etching rate of the first gate insulating film is low. In the case of conducting dry etching, chlorine ($Cl_2$), a mixed gas of chlorine ($Cl_2$) and oxygen ($O_2$), or the like can be used as an etching gas. Note that although the semiconductor films (i.e., the first doped semiconductor film and the first non-doped semiconductor film) can be etched by $CF_4$, $CF_4$ is not favorable because if $CF_4$ is used, etching selectivity of the semiconductor films to the first gate insulating film is low. In the case of conducting wet etching, an alkaline solution can be used.

In Embodiment Mode 1, a two-step etching including the first etching and the second etching is conducted, but in this embodiment mode, only the fifth etching is conducted, so that the first gate insulating film 102 over the second gate electrode 201 is left.

When the first gate insulating film is left, damage to the second gate electrode 201 can be greatly reduced.

Figure 7B:
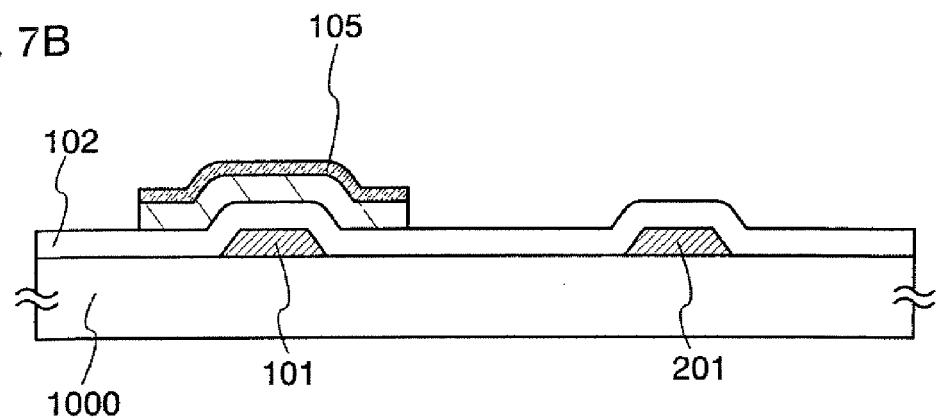

After the fifth etching, the mask is removed (see FIG. 7B).

Figure 7C:
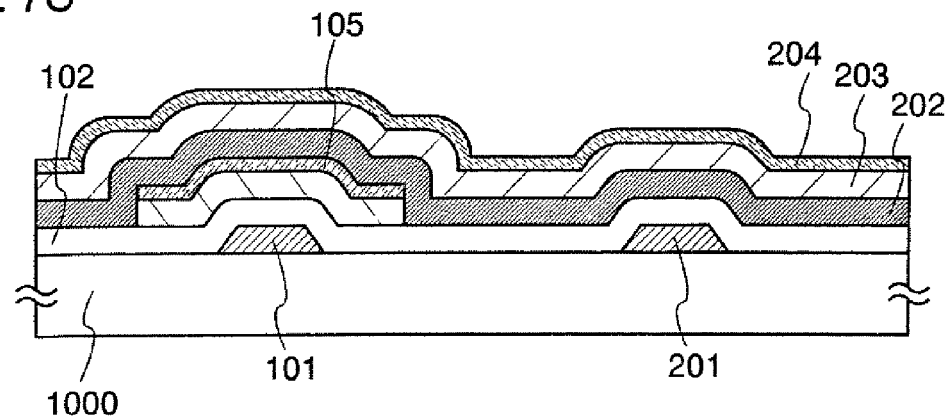

Then, the second gate insulating film 202, the second non-doped semiconductor film 203, and the second doped semiconductor film 204 are formed in that order over first island-shaped semiconductor layer 105 and the first gate insulating film 102 (see FIG. 7C). At this time, it is preferable to form the second gate insulating film, the second non-doped semiconductor film, and the second doped semiconductor film successively.

Figure 8A:
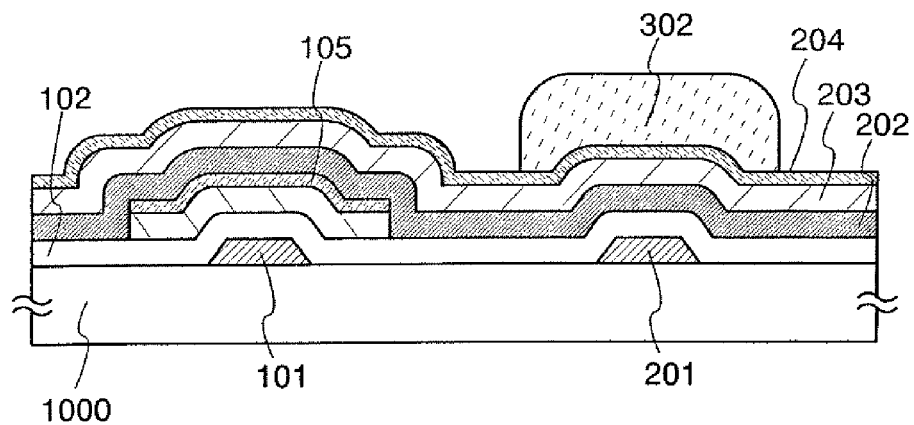
FIGS. 8A to 8C are cross-sectional views of a method of manufacturing a semiconductor device (Embodiment Mode 4)

The mask 302 is formed over the second doped semiconductor film 204 which is formed over the second gate electrode 201 (see FIG. 8A).

Figure 8B:
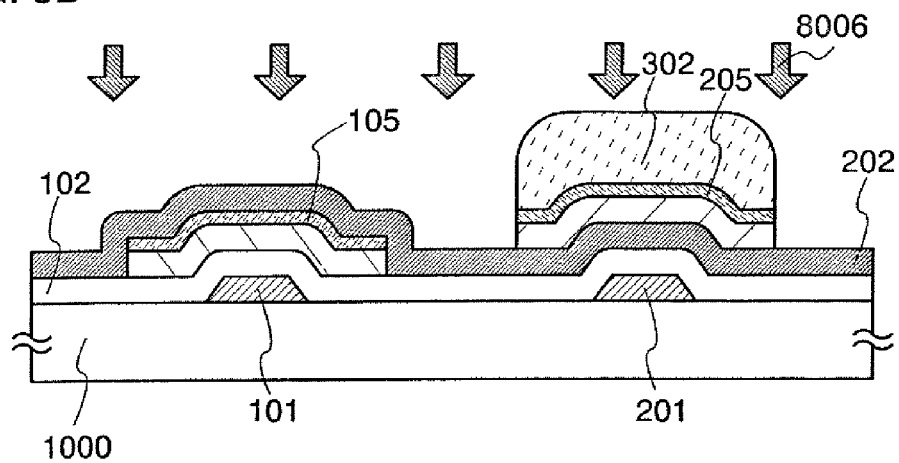

After the mask 302 is formed, a sixth etching 8006 is conducted in order to form an island-shaped semiconductor layer of the PTFT (see FIG. 8B).

By the sixth etching, the second non-doped semiconductor film 203 and the second doped semiconductor film 204 over the first gate electrode 101 are entirely removed. Accordingly, by the sixth etching, the second gate insulating film 202 is exposed and the second island-shaped semiconductor layer 205 is formed in which a non-doped semiconductor layer and a doped semiconductor layer are stacked (see FIG. 8B).

Figure 8C:
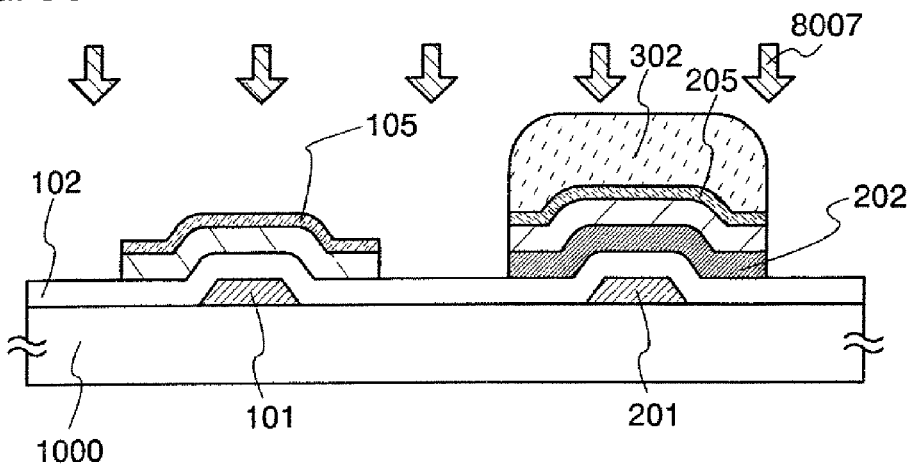

Then, a seventh etching 8007 is conducted using etching conditions different from those in the sixth etching without removing the mask. By the seventh etching, the second gate insulating film 202 over the first island-shaped semiconductor layer 105 is removed (see FIG. 8C).

A two-step etching is conducted because when the second gate insulating film 202 which is over the first island-shaped semiconductor layer 105 serves as an etching stopper, damage to the first island-shaped semiconductor layer 105 can be prevented.

Here, damage refers to, for example, reduction in thickness or size of the first island-shaped semiconductor layer due to etching of the first island-shaped semiconductor layer. In the case of conducting dry etching, electrical damage by plasma also occurs.

Therefore, the sixth etching employs conditions in which the etching rate of the second gate insulating film is lower than that of the semiconductor layers. On the other hand, the seventh etching employs conditions in which the etching rate of the first island-shaped semiconductor layers is lower than that of the second gate insulating film.

In other words, the sixth etching is conducted using conditions in which the etching rate of a low film is lower than that of an upper lower film. Note that the lower the etching rate of the lower film, the better.

In other words, the sixth etching is conducted in order to remove the second non-doped semiconductor film 203 and the second doped semiconductor film 204 formed over the second gate insulating film 202. Therefore, the sixth etching is conducted using conditions in which the etching rate of the second gate insulating film is lower than that of the second non-doped semiconductor film and the second doped semiconductor film. In the case of conducting dry etching, chlorine ($Cl_2$), a mixed gas of chlorine ($Cl_2$) and oxygen ($O_2$) can be used as an etching gas.

Note that although the semiconductor films (i.e., the second doped semiconductor film and the second non-doped semiconductor film) can be etched by $CF_4$, $CF_4$ is not favorable because if $CF_4$ is used, etching selectivity of the semiconductor films to the second gate insulating film is low.

In the case where the sixth etching is wet etching, an alkaline solution can be used.

The seventh etching is conducted in order to remove the second gate insulating film (the etching stopper film) which is formed over the first island-shaped semiconductor layer 105.

Therefore, the seventh etching is conducted using conditions in which the etching rate of the second gate insulating film is high and the etching rate of the first island-shaped semiconductor layer 105 is low.

In the case of conducting dry etching, it is not favorable to use $CF_4$ alone, because if $CF_4$ is only used, etching selectivity of the second gate insulating film to the semiconductor films (i.e., the first doped semiconductor film and the first non-doped semiconductor film) is low.

Note that when hydrogen is mixed into $CF_4$, the etching selectivity is high. Accordingly, a mixed gas of $CF_4$ and hydrogen ($H_2$), $CHF_3$, or the like can be used.

In the case of conducting wet etching, hydrofluoric acid (HF) or the like can be used.

Figure 9A:
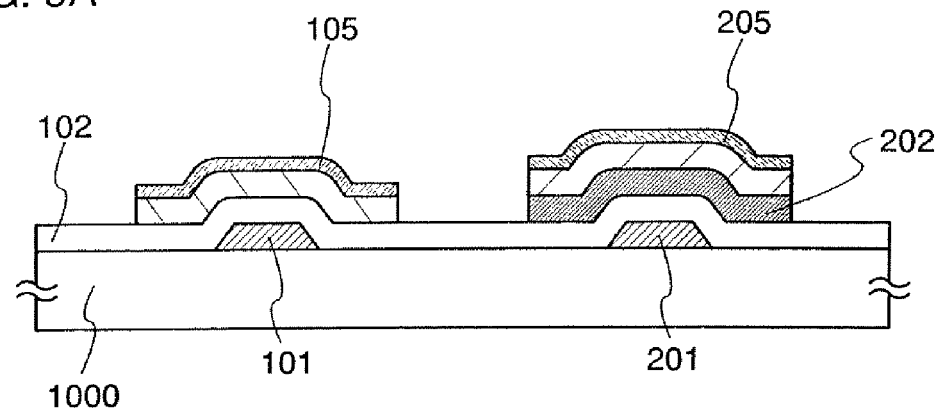
FIGS. 9A to 9C are cross-sectional views of a method of manufacturing a semiconductor device (Embodiment Mode 4)

After the seventh etching, the mask is removed (see FIG. 9A).

As described above, the gate insulating film of one of the NTFT and the PTFT serves as a protection film (an etching stopper film) for an island-shaped semiconductor layer of the other one of the NTFT and the PTFT; accordingly, the number of mask formations can be reduced in the case of forming both NTFTs and PTFTs.

Further, a semiconductor layer containing an impurity element which imparts conductivity can be formed both in the NTFT and the PTFT.

Further, in the above described structure, the gate insulating film, the non-doped semiconductor film, and the doped semiconductor film can be formed in both in the NTFT and the PTFT successively.

Comparing the case in which the gate insulating film, the non-doped semiconductor film, and the doped semiconductor film are not successively formed in one of the NTFT and the PTFT with the case in which the gate insulating film, the non-doped semiconductor film, and the doped semiconductor film are formed successively both in the NTFT and the PTFT are compared, the latter case has a significant advantageous effect of reducing variation among TFTs and is preferable.

Figure 9B:
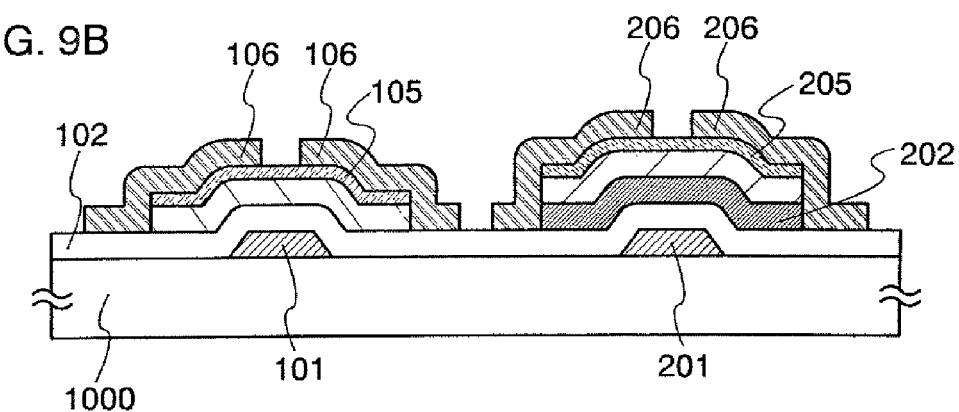

Then, the first wiring 106 and the second wiring 206 are formed over the first island-shaped semiconductor layer 105 and the second island-shaped semiconductor layer 205, respectively, at the same time (see FIG. 9B). The first wiring 106 and the second wiring 206 are formed as follows: a conductive film is formed, a mask is formed, etching is conducted, and then, the mask is removed.

Figure 9C:
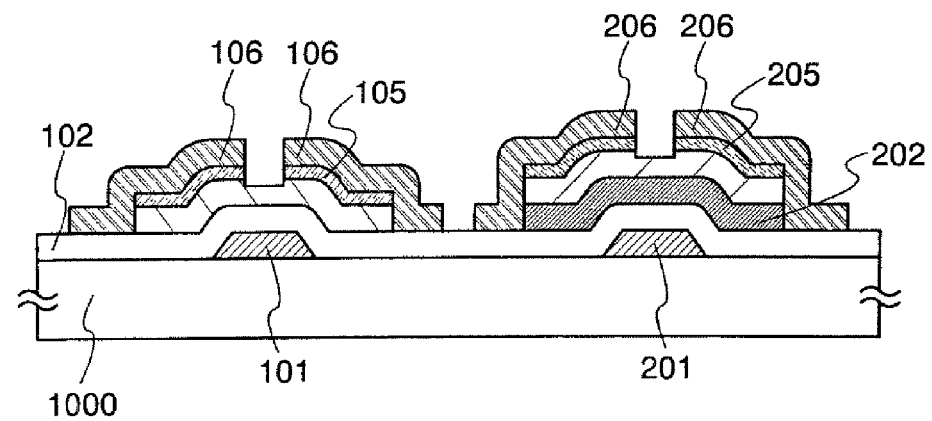

Then, the doped semiconductor film in an upper layer of the first island-shaped semiconductor layer 105 and the doped semiconductor film in an upper layer of the second island-shaped semiconductor layer 205 are etched with the first wiring 106 and the second wiring 206 serving as a mask (see FIG. 9C). By this step, channel formation regions, source regions, and drain regions are determined (formed) in the first island-shaped semiconductor layer 105 and the second island-shaped semiconductor layer 205.

Figure 10A:
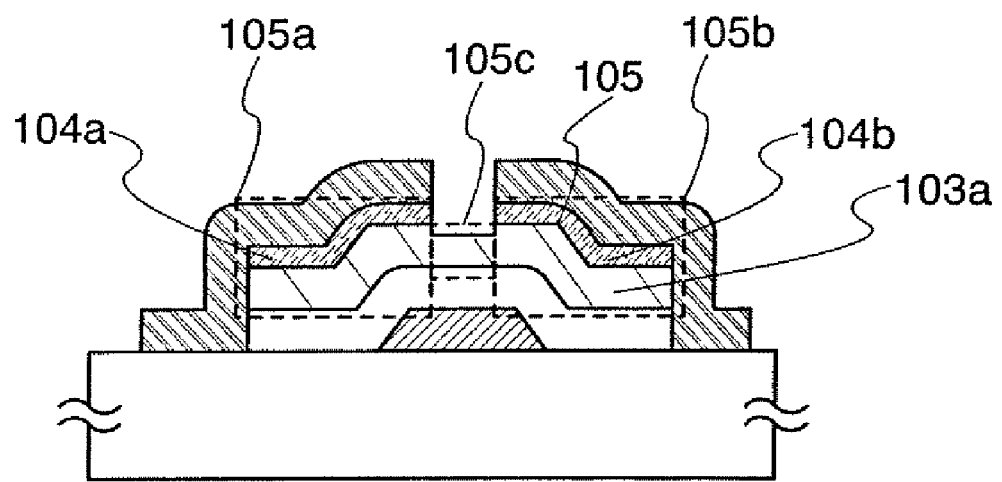
FIGS. 10A and 10B are cross-sectional views of a method of manufacturing a semiconductor device (Embodiment Mode 4)

FIG. 10A is an enlarged view of the NTFT in FIG. 9C.

In FIG. 10A, the channel formation region in the first island-shaped semiconductor layer 105 is a region denoted by 105c.

One of a first source region and a first drain region in the first island-shaped semiconductor layer 105 is a region denoted by 105a (see FIG. 10A).

The other one of the first source region and the first drain region in the first island-shaped semiconductor layer 105 is a region denoted by 105b (see FIG. 10A).

The first island-shaped semiconductor layer 105 has a structure in which the doped semiconductor layer 104a formed in the region denoted by 105a, which is one of the first source region and the first drain region, and the doped semiconductor layer 104b formed in the region denoted by 105b, which is the other one of the first source region and the first drain region, are stacked over the non-doped island-shaped semiconductor layer 103a (see FIG. 10A).

Figure 10B:
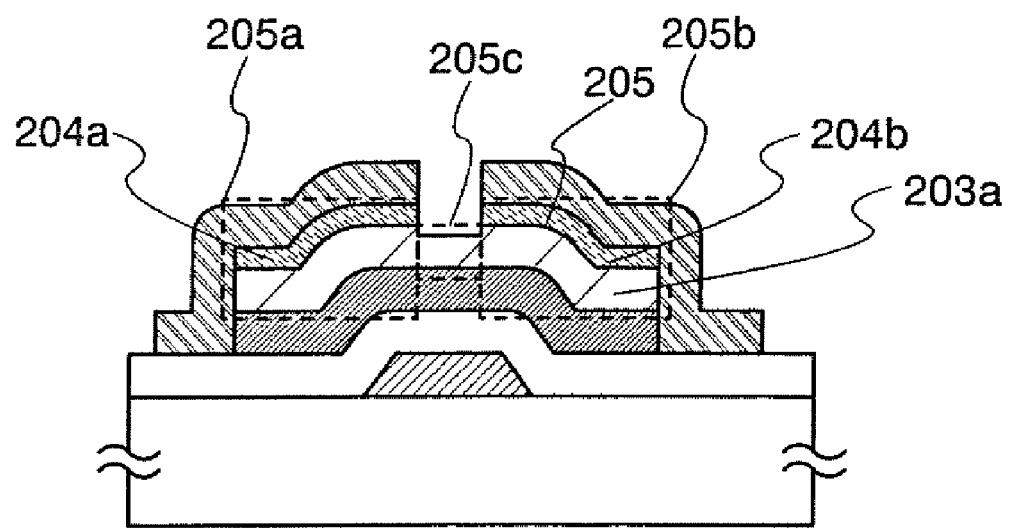

FIG. 10B is an enlarged view of the PTFT in FIG. 9C.

In FIG. 10B, a channel formation region in the second island-shaped semiconductor layer 205 is a region denoted by 205e.

One of a second source region and a second drain region in the second island-shaped semiconductor layer 205 is a region denoted by 205a (see FIG. 10B).

The other one of the second source region and the second drain region in the second island-shaped semiconductor layer 205 is a region denoted by 205b (see FIG. 10B).

The second island-shaped semiconductor layer 205 has a structure in which the doped semiconductor layer 204a formed in the region denoted by 205a, which is one of the second source region and the second drain region, and the doped semiconductor layer 204b formed in the region denoted by 205b, which is the other one of the second source region and the second drain region, are stacked over the non-doped island-shaped semiconductor layer 203a (see FIG. 10B).

Subsequently, a pixel electrode which is electrically connected to one of to the NTFT and the PTFT is formed. Whether the pixel electrode is electrically connected to the NTFT or to the PTFT can be selected as appropriate by those skilled in the art depending on a type of a display device, a circuit structure, or the like. For example, in the case of a liquid crystal display device, it is preferable to electrically connect the pixel electrode to the NTFT, while in the case of an EL display device, it is preferable to electrically connect the pixel electrode to the PTFT. In this embodiment mode, the pixel electrode is electrically connected to the first wiring 106.

Note that in the case of manufacturing a reflective display device, the pixel electrode may be formed at the same time as the first wiring 106 and the second wiring 206.

Then, after an interlayer insulating film is formed, a display element is formed.

For example, in the case of a liquid crystal display device, a counter substrate provided with a counter electrode, a color filter, and the like is prepared. Then, alignment films are formed on the counter substrate and the substrate provided with TFTs. After the substrate provided with TFTs and the counter substrate are attached to each other with a sealant, liquid crystal is injected between the substrate provided with TFTs and the counter substrate. In this case, a display element is a part in which the pixel electrode, the liquid crystal, and the counter electrode overlap.

For example, in the case of an EL display device, a layer including a light emitting layer is formed over the pixel electrode and an electrode is formed over the layer including the light emitting layer. Then, a counter substrate is prepared, and the counter substrate and a substrate provided with TFTs are attached to each other with a sealant. In this case, a display element is a part in which the pixel electrode, the layer including the light emitting layer, and the electrode overlap.

Note that according to this embodiment mode, the thickness of the gate insulating film of the NTFT and that of the gate insulating film of the PTFT can be different.

In this case, the thickness of the gate insulating film in one of the NTFT and the PTFT is the thickness of the first gate insulating film 102 and the thickness of the gate insulating film in the other one of the NTFT and the PTFT equals the sum of the thickness of the first gate insulating film 102 and the second gate insulating film 202.

Further, the first gate insulating film 102 over the second gate electrode 201 may be overetched in the fifth etching and to reduce the thickness of the first gate insulating film 102, thereby controlling the thickness of the gate insulating film in the other one of the NTFT and the PTFT.

Note that by controlling the conditions of the overetching and the thickness of the first gate insulating film 102 and the second gate insulating film 202 at the time of formation, the thickness of the gate insulating films in the NTFT and the PTFT can be the same even when a method described in this embodiment mode is employed.

[Embodiment Mode 5]

In this embodiment mode, a concentration profile of an impurity in the doped semiconductor film and the non-doped semiconductor film in Embodiment Modes 1 to 4 is described with reference to FIGS. 11A to 11C. Note that the concentration of an impurity in this embodiment mode refers to the concentration of an impurity element which imparts conductivity.

Figure 11A:
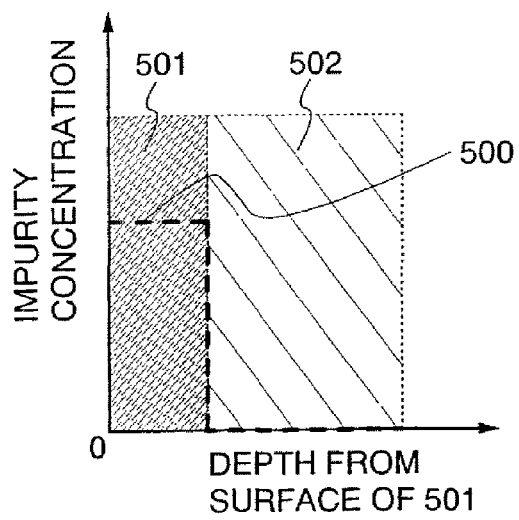
FIGS. 11A to 11C are graphs for comparing impurity concentration profiles (Embodiment Mode 5)

FIG. 11A shows the concentration profile of an impurity in a semiconductor film in which a non-doped semiconductor film 501 and a doped semiconductor film 502 are stacked. In FIG. 11A, the concentration profile is indicated by line 500 in the graph in which the vertical axis indicates the impurity concentration (atom/cm$^3$) and the horizontal axis indicates the depth (nm) from the surface of the non-doped semiconductor film 501.

When a non-doped semiconductor film and a doped semiconductor film are stacked as in FIG. 11A, the concentration profile of the impurity element which imparts conductivity can be discontinuous at the interface between the non-doped semiconductor film and the doped semiconductor film (i.e., the impurity concentration greatly changes at the interface between the non-doped semiconductor film and the doped semiconductor film).

Accordingly, the position of the interface can be clearly defined from the concentration profile of the impurity element. When the concentration profile of the impurity element is discontinuous as described above, the band gap differs at the interface; therefore, leakage current can be reduced. With reduced leakage current, variation in current can be reduced when TFTs are off, so that reliability of TFTs can be improved (i.e., good OFF characteristics are provided). In addition, since the doped semiconductor film has low resistivity, current does not decrease when TFTs are on (i.e., good ON characteristics are provided).

Figure 11B:
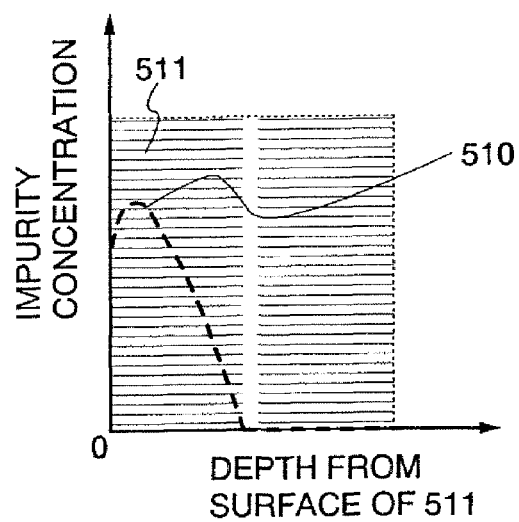

FIG. 11B shows the concentration profile of an impurity in a semiconductor film 511 which is formed, subjected to impurity doping by an ion implantation method, and then subjected to an anneal. Note that an anneal for lowering resistance of the region to which the impurity is added is conducted at a temperature of 600° C. or higher. In FIG. 11B, the concentration profile is indicated by line 510 in the graph in which the vertical axis indicates the impurity concentration (atom/cm$^3$) and the horizontal axis indicates the depth (nm) from the surface of the semiconductor film 511.

Figure 11C:
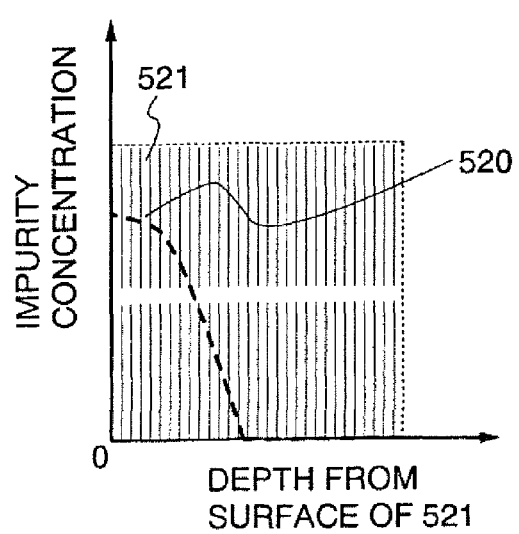

FIG. 11C is a schematic diagram of the concentration profile of an impurity in a semiconductor film 521 which is formed and subjected to impurity doping by a thermal diffusion method. Note that thermal diffusion is conducted at a temperature of 800° C. or higher. In FIG. 11C, the concentration profile is indicated by line 520 is shown in the graph in which the vertical axis indicates the impurity concentration (atom/cm$^3$) and the horizontal axis indicates the depth (nm) from the surface of the semiconductor film 521.

As shown in FIGS. 11B and 11C, when an ion implantation method or a thermal diffusion method is used, the concentration gets lower as it gets near the substrate, and the position of the interface cannot be clearly defined.

In other words, there is not a large difference at the interface between the semiconductor film which does not contain an impurity element and the semiconductor film which contains an impurity element.

Therefore, in the case of employing an ion implantation method or a thermal diffusion method, the band gap cannot differ at the interface (in addition, the position of the interface is not distinct).

Further, since heat treatment should be conducted at least 600° C. or higher when an ion implantation method or a thermal diffusion method is used, a substrate with low heat resistance cannot be used.

On the other hand, in the case of stacking a non-doped semiconductor film and a doped semiconductor film, a semiconductor device can be manufactured at a temperature equal to or lower than the temperature in formation of the non-doped semiconductor film or the doped semiconductor film (e.g., 300° C. or lower in the case of Embodiment Modes 1 to 4). Since an anneal for activating an impurity is not necessary, a semiconductor device having a structure with reduced variation in electrical characteristics among thin film transistors can be provided. Further, by omitting an anneal step, the number of manufacturing steps can be reduced, and a substrate with low heat resistance (e.g., a substrate of a resin) can be used.

[Embodiment Mode 6]

In this embodiment mode, the general structure of a semiconductor device using the thin film transistor which is described in Embodiment Modes 1 to 5 is described.

Figure 12:
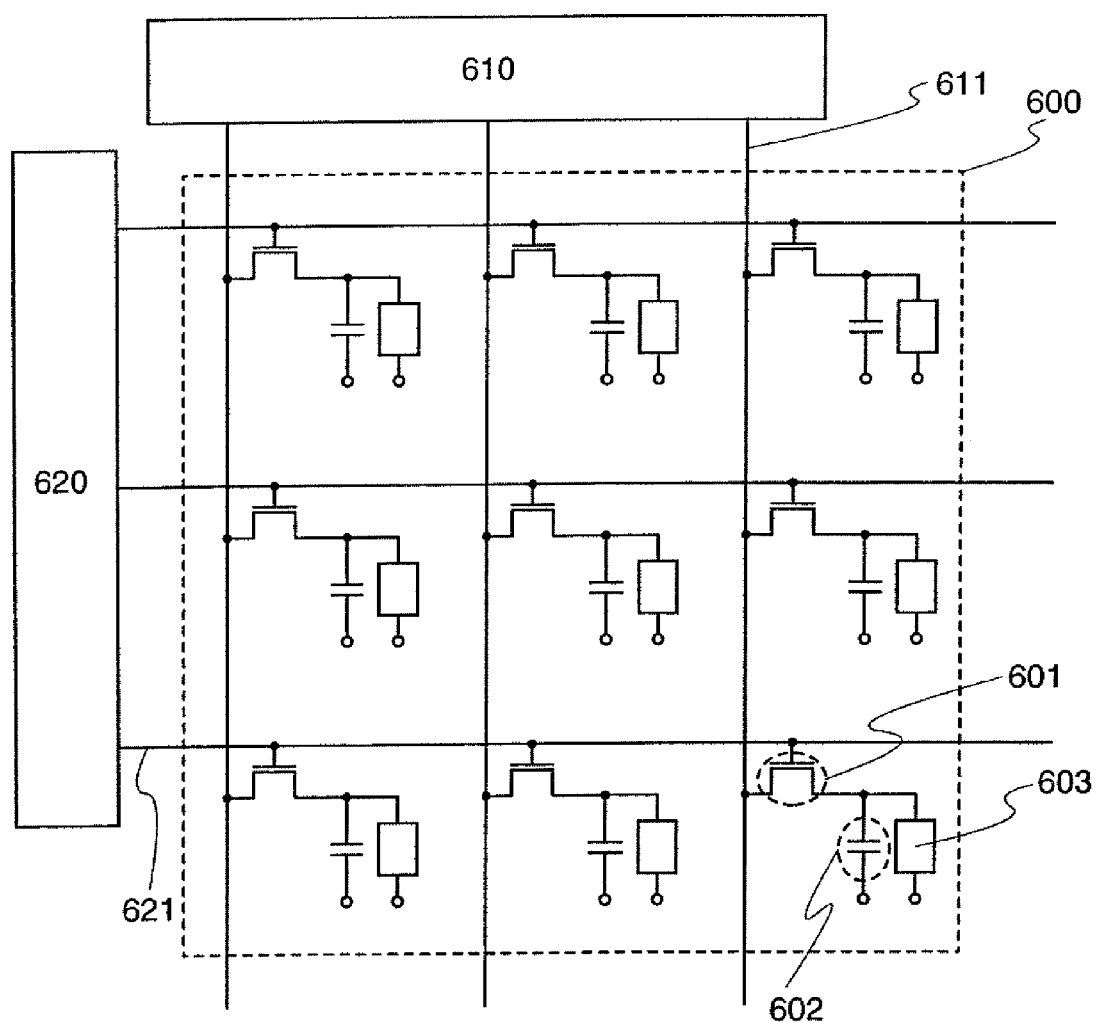
FIG. 12 is a circuit diagram showing connection relations of elements (Embodiment Mode 6)

FIG. 12 shows an example of a circuit diagram of a semiconductor device according to the present invention. A signal supply circuit 610 is electrically connected to a pixel portion 600 via a plurality of source bus lines 611.

A scan circuit 620 is electrically connected to the pixel portion 600 via a plurality of gate bus lines 621 (see FIG. 12).

In the pixel portion 600, a plurality of pixel TFTs 601, a plurality of storage capacitors 602, and a plurality of display elements 603 are arranged in matrix (see FIG. 12).

A gate terminal of the pixel TFT 601 is electrically connected to the gate bus line 621 (see FIG. 12).

One of a source terminal and a drain terminal of the pixel TFT 601 is electrically connected to the source bus line 611 (see FIG. 12).

The other one of the source terminal and the drain terminal of the pixel TFT 601 is electrically connected to the storage capacitor 602 and the display element 603 (see FIG. 12).

A peripheral circuit (e.g., the signal supply circuit 610 and the scan circuit 620) includes both NTFTs and PTFTs. When the peripheral circuit includes both NTFTs and PTFTs, power consumption can be greatly reduced, compared with a case in which the peripheral circuit includes either NTFTs or PTFTs.

The pixel TFT 601 is either an NTFT or a PTFT.

[Embodiment Mode 7]

A method of manufacturing the semiconductor device described in Embodiment Mode 6 is described with reference to FIGS. 13A to 16C.

Note that portions which are denoted by the same reference numerals as those in Embodiment Modes 1 to 6 can be formed of the materials mentioned in Embodiment Mode 3.

Further, while a method of forming an NTFT and a PTFT in this embodiment mode is the same as the method described in Embodiment Mode 1, this embodiment mode can employ a method in another embodiment mode (in particular, a method as in Embodiment Mode 4 in which a gate insulating film of one of the NTFT and the PTFT is a single layer and a gate insulating film of the other one of the NTFT and the PTFT is a stack-layer).

The pixel TFT 601 may be an NTFT or a PTFT. In this embodiment mode, the pixel TFT 601 is an NTFT.

Figure 13A:
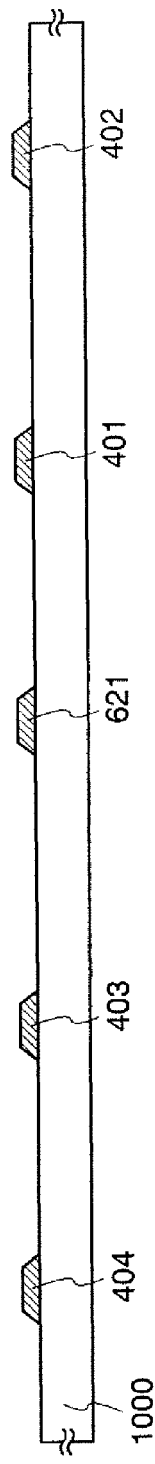
FIGS. 13A to 13C are cross-sectional views of a method of manufacturing a semiconductor device (Embodiment Mode 7)

First, a gate electrode 403 of the pixel TFT, a gate electrode 401 of an NTFT 631 in an peripheral circuit portion, a gate electrode 402 of a PTFT 632 in the peripheral circuit portion, a gate bus line 621, and a lower electrode 404 (a gate electrode) of the storage capacitor 602 are formed over a substrate (see FIG. 13A).

The gate electrode 403 of the pixel TFT, the gate electrode 401 of the NTFT in the peripheral circuit, and the gate electrode 402 of the PTFT in the peripheral circuit can be formed of the same material and by the same method as those of the first gate electrode 101 and the second gate electrode 201 which are described in another embodiment mode.

Figure 13B:
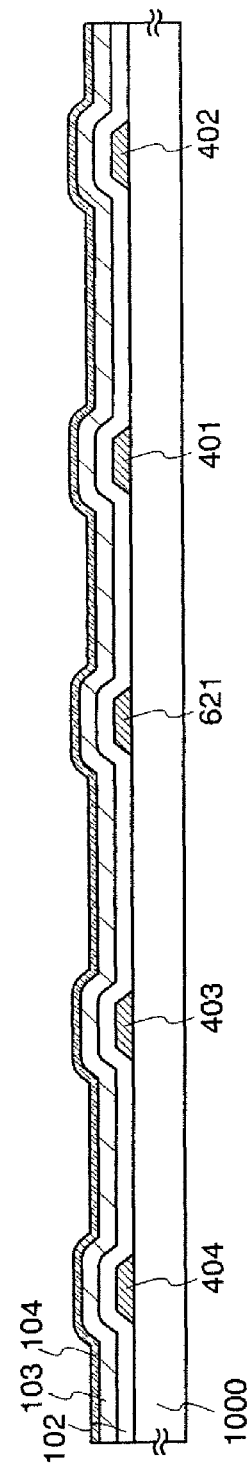

Then, the first gate insulating film 102, the first non-doped semiconductor film 103, and the first doped semiconductor film 104 are formed in that order (see FIG. 13B). At this time, it is preferable to form the first gate insulating film, the first non-doped semiconductor film, and the first doped semiconductor film successively.

Figure 13C:
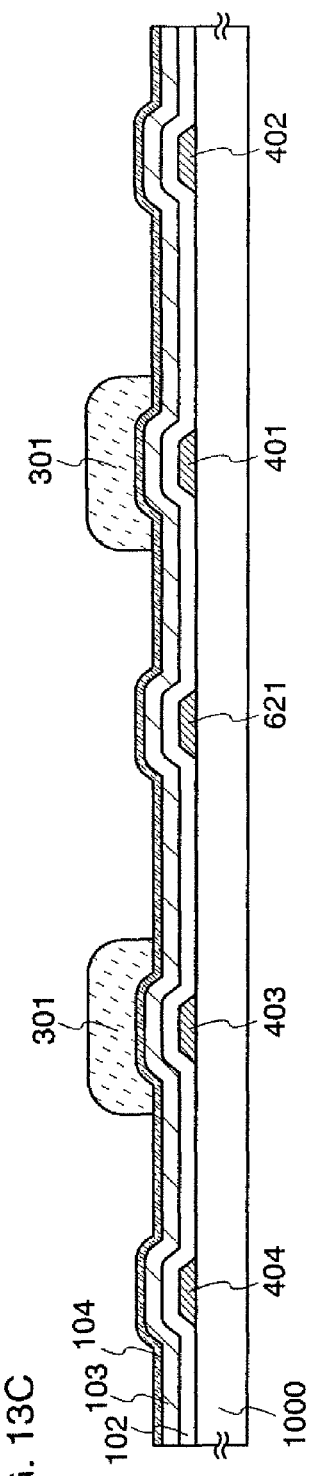

The masks 301 are formed over parts of the first doped semiconductor film 104 which are formed over the gate electrode 403 of the pixel TFT and the gate electrode 401 of the NTFT in the peripheral circuit portion (see FIG. 13C).

Then, the first and second etchings (the two-step etching) are conducted as in Embodiment Mode 1, so that the first gate insulating film 102, the first non-doped semiconductor film 103, and the first doped semiconductor film 104 are removed except for the parts where the masks 301 are formed. After that, the masks 301 are removed (see FIG. 14A).

By conducting the first etching and the second etching (the two-step etching), etching damage to the gate electrode 402 of the PTFT in the peripheral circuit portion, the gate bus line 621, and the lower electrode 404 of the storage capacitor 602 can be reduced.

In particular, if the gate bus line 621 is damaged, resistance thereof is increased, which leads to operation delay of the semiconductor device; therefore, it is preferable to conduct the first and second etchings (the two-step etching).

Figure 14A:
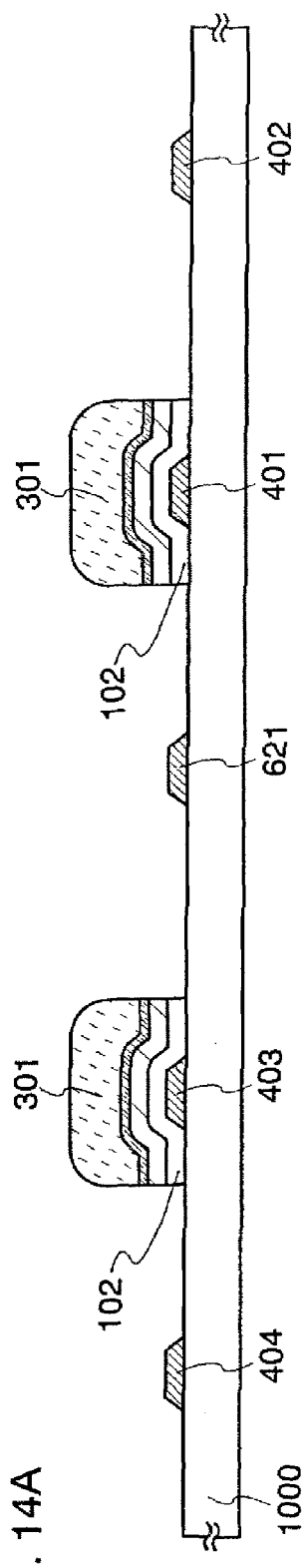
FIGS. 14A to 14C are cross-sectional views of a method of manufacturing a semiconductor device (Embodiment Mode 7)
Figure 14B:
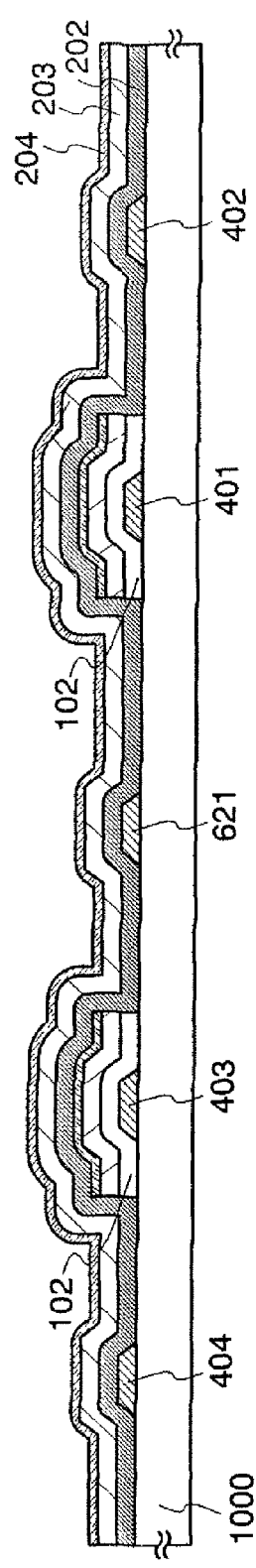

Then, the second gate insulating film 202, the second non-doped semiconductor film 203, and the second doped semiconductor film 204 are formed in that order (see FIG. 14B). At this time, it is preferable to form the second gate insulating film, the second non-doped semiconductor film, and the second doped semiconductor film successively.

Figure 14C:
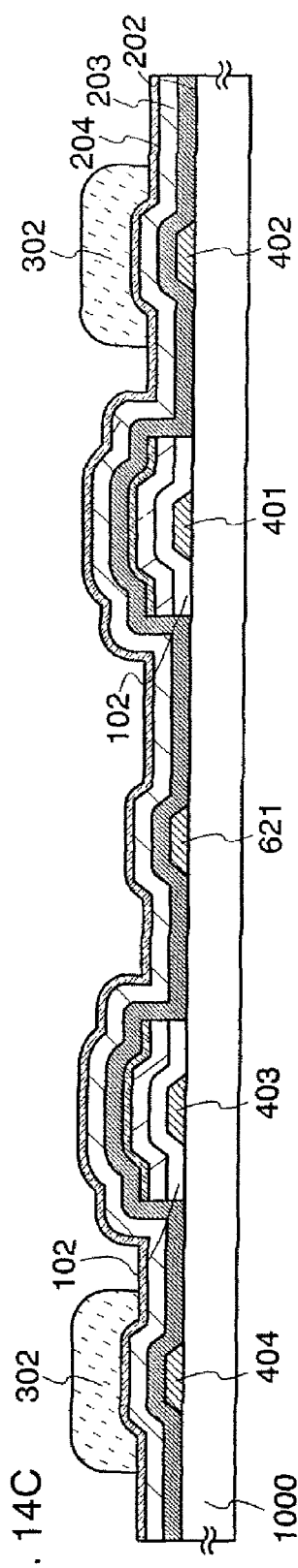

The masks 302 are formed over parts of the second doped semiconductor film 204 which are formed over the lower electrode 404 of the storage capacitor 602 and the gate electrode 402 of the PTFT in the peripheral circuit portion (see FIG. 14C).

Note that if the mask 302 is not formed over the lower electrode 404 of the storage capacitor 602, the lower electrode 404 of the storage capacitor 602 is also removed in the subsequent third and fourth etchings.

If the lower electrode 404 of the storage capacitor 602 is etched, it is necessary to form another insulating film, to form a mask over the insulating film, and to conduct etching in order to form the storage capacitor; thus, the number of masks is increased.

Accordingly, it is important for reduction in the number of masks to form the mask 302 over the lower electrode 404 of the storage capacitor 602.

Then, the third etching and the fourth etching (the two-step etching) are conducted as in Embodiment Mode 1, so that the second gate insulating film 203, the second non-doped semiconductor film 204, and the second doped semiconductor film 204 are removed except for the parts where the masks 302 are formed. After that, the masks are removed (see FIG. 15A).

Then, wirings 606a to 606f are formed over the gate electrode 403 of the pixel TFT, the gate electrode 401 of the NTFT in the peripheral circuit portion, the gate electrode 402 of the PTFT in the peripheral circuit portion, and the lower electrode 404 of the storage capacitor 602 (see FIG. 15B).

The wirings 606a to 606f can be formed of the same material and by the same method as those of the first wiring 106 and the second wiring which are described in another embodiment mode.

As shown in the drawing, the wiring 606a is an upper electrode of the storage capacitor 602 and is formed over one of a source region or a drain region of the pixel TFT 601 (see FIG. 15B).

Then, etching is conducted with the wirings 606a to 606d serving as masks to determine channel formation regions, source regions, and drain regions in the pixel TFT, the NTFT in the peripheral circuit portion, and the PTFT in the peripheral circuit portion (see FIG. 15C).

In this etching, the non-doped semiconductor layer which serves as a channel formation region is slightly etched. A TFT formed in this manner is referred to as a channel-etch type TFT (thin film transistor).

The storage capacitor 602 has a structure in which the lower electrode 404, the second gate insulating film 202, the second non-doped semiconductor film 203, the second doped semiconductor film 204, and the wiring 606a of the storage capacitor 602 are stacked in that order (see FIG. 15C).

Note that in a conventional semiconductor device which includes either NTFTs or PTFTs, when the semiconductor device has an inverted staggered TFT, a method is employed in which a lower electrode of a storage capacitor is formed at the same time as a gate electrode, a dielectric film of the storage capacitor is formed at the same time as a gate insulating film, and an upper electrode of the storage capacitor is formed at the same time as a wiring.

In the above-described conventional method, since the dielectric film of the storage capacitor is damaged by etching in etching for forming an island-shaped semiconductor layer of a TFT, there is a problem of variation in electrical characteristics among storage capacitors.

By employing a method described in this embodiment mode, a problem of the conventional method can be solved and variation among storage capacitors can be reduced. In addition, the number of masks does not increase. Further, by forming the gate insulating film, the non-doped semiconductor film, and the doped semiconductor film successively, an advantageous effect of reducing variation among storage capacitors can be enhanced, which is preferable.

Then, an interlayer insulating film 607 is formed so as to cover the pixel TFT 601, the storage capacitor 602, the NTFT 631 in the peripheral circuit portion, the PTFT 632 in the peripheral circuit portion, and the gate bus line 621 (see FIG. 16A).

Then, after forming contact holes which reach source and drain regions of the pixel TFT 601, the NTFT 631 in the peripheral circuit portion, and the PTFT 632 in the peripheral circuit portion, the source bus line 611a and wirings 611b to 611d in the peripheral circuit portion are formed (see FIG. 16B).

The source bus line 611a and the wirings 611b to 611d can be formed of the same material and by the same method as those of the first wiring 106 and the second wiring which are described in another embodiment mode.

Then, the pixel electrode 608 is formed (see FIG. 16C).

The pixel electrode 608 can be formed of the same material and by the same method as those of the pixel electrode which are described in another embodiment mode.

Note that the gate bus line 621 may be formed after the pixel electrode 608 is formed.

Since FIG. 16C is a cross-sectional view, although the pixel TFT 601 and the pixel electrode 608 are illustrated as if they overlap with each other, the pixel electrode 608 extends so as not to overlap with the pixel TFT 601 and the storage capacitor 602.

Note that in the case of a reflective liquid crystal display device or a top emission EL display device, the pixel electrode 608 may be provided only in a position which overlaps with the pixel TFT 601 and the storage capacitor 602.

Then, a display element is formed.

For example, in the case of a liquid crystal display device, a counter substrate provided with a counter electrode, a color filter, and the like is prepared. Then, alignment films are formed on the counter substrate and the substrate provided with TFTs. After the substrate provided with TFTs and the counter substrate are attached to each other with a sealant, liquid crystal is injected between the substrate provided with TFTs and the counter substrate. In this case, a display element is a part in which the pixel electrode, the liquid crystal, and the counter electrode overlap.

For example, in the case of an EL display device, a layer including a light emitting layer is formed over the pixel electrode and an electrode is formed over the layer including the light emitting layer. Then, a counter substrate is prepared, and the counter substrate and a substrate provided with TFTs are attached to each other with a sealant. In this case, a display element is a part in which the pixel electrode, the layer including the light emitting layer, and the electrode overlap.

[Embodiment Mode 8]

In Embodiment Mode 7, the mask 302 is formed over the lower electrode 404 of the storage capacitor 602 and the mask 301 is not formed over the lower electrode 404 of the storage capacitor 602; thus, the number of masks is reduced.

The number of masks can also be reduced by forming the mask 301 over the lower electrode 404 of the storage capacitor 602 and by omitting the mask 302 over the lower electrode 404 of the storage capacitor 602 in the method described in Embodiment Mode 7.

In this case, the storage capacitor 602 has a structure in which the lower electrode 404, the first gate insulating film 102, the first non-doped semiconductor film 103, the first doped semiconductor film 104, and the wiring 606a of the storage capacitor 602 are stacked in that order.

[Embodiment Mode 9]

When the method described in Embodiment Mode 7 or 8 is used, the thickness of the gate insulating films in the pixel TFT 601, in the storage capacitor 602, in the NTFT 631 in the peripheral circuit portion, and in the PTFT 632 in the peripheral circuit portion can be purposely varied. Such a case includes a case in which the thicknesses of the two kinds of gate insulating films are the same and a case in which the thicknesses of the two kinds of gate insulating films are different from each other.

Here, it is preferable that the gate insulating film of the pixel TFT be thick and the gate insulating film of the storage capacitor 602 be thin.

It is advantageous to use a thin gate insulating film, for example, in that a pixel TFT has an increased current value when the pixel TFT is ON (i.e., good ON characteristics are provided); however, it is also disadvantageous to use a thin gate insulating film in that the withstand voltage of the gate insulating film is lowered and leakage current easily flows because of increased pin holes in the gate insulating film.

If leakage occurs, current flows even when the pixel TFT is OFF, which means that the pixel TFT does not perform its function.

Accordingly, in the pixel TFT, the thicker the gate insulating film is, the less possible leakage occurs (i.e., good ON characteristics are provided).

The pixel TFT preferably has a thick gate insulating film to achieve good OFF characteristics.

On the other hand, since the gate insulating film in the storage capacitor 602 is a dielectric, the gate insulating film is preferably thin because the charge amount which can be held can be increased.

Accordingly, a structure in which the thickness of the gate insulating film of the pixel TFT is larger than the thickness of the gate insulating film of the storage capacitor is favorable.

Here, when the thickness of the gate insulating film is large, there arises a problem in that ON characteristics are degraded.

Therefore, the TFT having a gate insulating film with a larger thickness preferably is an NTFT. This is because, when an NTFT and a PTFT are compared, the mobility of the NTFT is higher than that of the PTFT due to the difference in effective mass of carriers, and the high mobility leads to improved ON characteristics; thus, the foregoing problem can be solved.

In addition, since the PTFT has low ON characteristics compared with NTFT, the PTFT preferably has a thin gate insulating film. Accordingly, the thickness of the gate insulating film of the PTFT is preferably smaller than that of a gate insulating film of the NTFT. By this, variation in ON characteristics among TFTs used in a circuit can be reduced. The TFTs can be used for any circuits, such as peripheral circuits, a CPU, or an RFID.

Therefore, it is highly preferable that the pixel TFT be an NTFT and the thickness of the gate insulating film of the storage capacitor be thin compared with the thickness of the gate insulating film of the NTFT. Note that when the method described in Embodiment Modes 7 or 8 is employed in such a structure, the thickness of the gate insulating film of the storage capacitor and that of the gate insulating film of the PTFT are the same.

It is highly preferable that the thickness of the gate insulating film of the storage capacitor and the thickness of the gate insulating film of the PTFT be larger that of the gate insulating film of the NTFT, and that the pixel TFT be the NTFT.

[Embodiment Mode 10]

Examples of a semiconductor device of the present invention are described.

As semiconductor devices relating to the present invention, a television set (also simply referred to as a television or a television receiver), a camera such as a digital camera or a digital video camera, a mobile phone device (also simply referred to as a mobile telephone or a cellular phone), a portable information terminal such as a FDA, a portable game machine, a monitor for a computer, a computer, an audio player device such as a car audio set, an image player provided with a recording medium such as a home game machine, and the like can be given. Specific examples are described with reference to FIGS. 17A to 18E.

Figure 17A:
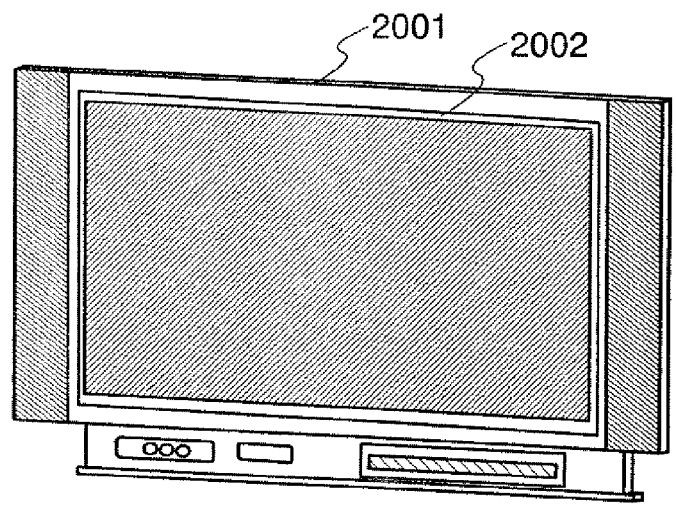
FIGS. 17A and 17B show examples of semiconductor devices (Embodiment Mode 10)

A television set shown in FIG. 17A includes a main body 2001, a display portion 2002, and the like.

The present invention can be applied to a control device and the display portion 2002 incorporated in the main body 2001.

Accordingly, the television set with high reliability and low power consumption can be provided. As the television set is larger in size or higher in definition, the number of TFTs is increased and variation in electrical characteristics among TFTs becomes evident. Therefore, the present invention is suitable for a large television set, a high definition television set, and the like. In particular, the present invention is suitable for a television set with VGA (video graphics array, 640 horizontal×480 vertical dots) resolution or a television set with a higher resolution than VGA.

Figure 17B:
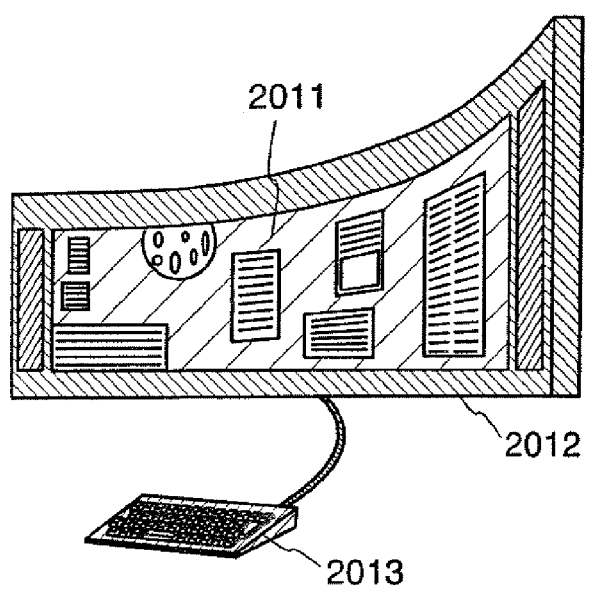

A display for a personal computer shown in FIG. 17B includes a main body 2011, a display portion 2012, a keyboard 2013, and the like.

The present invention can be applied to a control device and the display portion 2012 incorporated in the main body 2011.

Accordingly, the display for a personal computer with high reliability and low power consumption can be provided. As the display for a personal computer is larger in size or higher in definition, the number of TFTs is increased and variation in electrical characteristics among TFTs becomes evident. Therefore, the present invention is suitable for a large display for a personal computer, a high definition display for a personal computer, and the like. In particular, the present invention is suitable for a display for a personal computer with VGA (video graphics array, 640 horizontal×480 vertical dots) resolution or a display for a personal computer with a higher resolution than VGA.

Figure 18A:
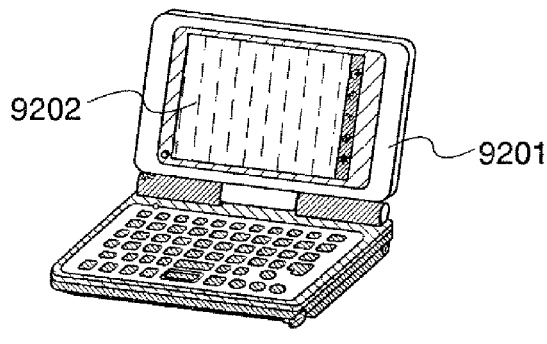
FIGS. 18A to 18E show examples of semiconductor devices (Embodiment Mode 10).

A portable information terminal shown in FIG. 18A includes a main body 9201, a display portion 9202, and the like.

The present invention can be applied to a control device and the display portion 9202 incorporated in the main body 9201.

Accordingly, the portable information terminal with high reliability and low power consumption can be provided.

Figure 18B:
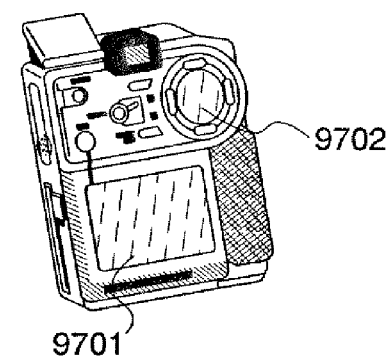

A digital video camera shown in FIG. 18B includes a main body 9701, a display portion 9702, and the like. By applying the present invention to the display portion 9702, variations among TFTs which is included therein are reduced; therefore, a digital video camera with high reliability and low power consumption can be provided.

Figure 18C:
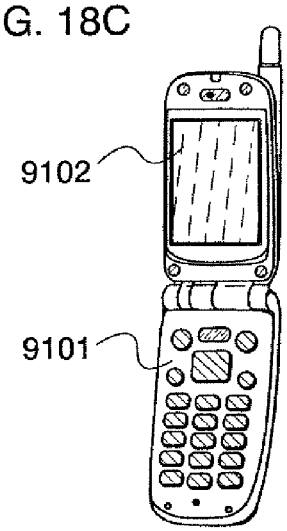

A mobile telephone shown in FIG. 18C includes a main body 9101, a display portion 9102, and the like.

The present invention can be applied to a control device and the display portion 9102 incorporated in the main body 9101.

Accordingly, the mobile telephone with high reliability and low power consumption can be provided.

Figure 18D:
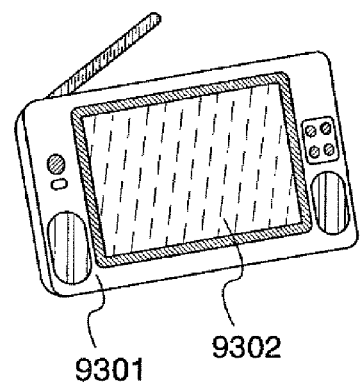

A portable television set shown in FIG. 18D includes a main body 9301, a display portion 9302, and the like.

The present invention can be applied to a control device and the display portion 9302 incorporated in the main body 9201.

Accordingly, the portable television set with high reliability and low power consumption can be provided.

As to a television set, the present invention can be widely applied to, for example, a small size television set which is mounted in a mobile terminal such as a mobile telephone, a middle size television device which is portable, and a large size television set (e.g., 40 inches or larger).

Figure 18E:
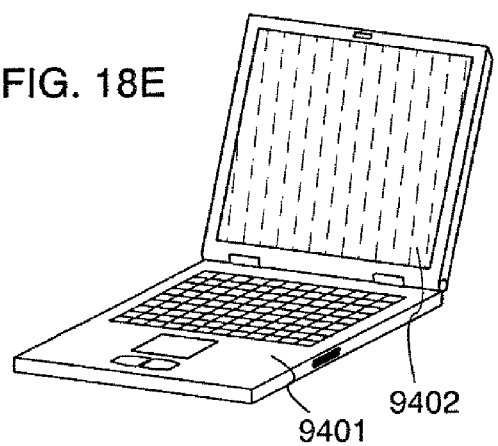

A portable computer shown in FIG. 18E includes a main body 9401, a display portion 9402, and the like.

The present invention can be applied to a control device and the display portion 9402 incorporated in the main body 9401.

Accordingly, the portable computer with high reliability and low power consumption can be provided.

Further, when a flexible substrate is used, a display (a display device) having a curved screen can be provided.

As described above, a semiconductor device with high reliability and low power consumption can be provided.

This application is based on Japanese Patent Application serial No. 2007-019662 filed in Japan Patent Office on Jan. 30, 2007, the entire contents of which are hereby incorporated by reference.

What is claimed is:

1. A method of manufacturing a semiconductor device, comprising:
    forming a first gate electrode and a second gate electrode;
    forming a first gate insulating film, a first non-doped semiconductor film, and a first doped semiconductor film including one of n-type and p-type conductivity in that order over the first gate electrode and the second gate electrode;
    removing the first non-doped semiconductor film and the first doped semiconductor film to form a first island-shaped semiconductor layer in which a first non-doped semiconductor layer and a first doped semiconductor layer are stacked in that order over the first gate electrode, and to expose the first gate insulating film formed over the second gate electrode;
    removing the exposed first gate insulating film to expose the second gate electrode;
    forming a second gate insulating film, a second non-doped semiconductor film, and a second doped semiconductor film including the other one of n-type and p-type conductivity in that order over the exposed second gate electrode and the first island-shaped semiconductor layer;
    removing the second non-doped semiconductor film and the second doped semiconductor film by a first etching to faun a second island-shaped semiconductor layer in which a second non-doped semiconductor layer and a second doped semiconductor layer are stacked in that order over the second gate electrode, and to expose the second gate insulating film formed over the first island-shaped semiconductor layer;
    removing the exposed second gate insulating film by a second etching to expose the first island-shaped semiconductor layer;
    forming a wiring over the first island-shaped semiconductor layer and the second island-shaped semiconductor layer; and
    partially removing the first doped semiconductor film and the second doped semiconductor film using the wiring as a mask.

2. The method of manufacturing a semiconductor device according to claim 1,
    wherein the first etching is conducted using a condition in which an etching rate of the second gate insulating film is lower than an etching rate of the second non-doped semiconductor film, and
    wherein the second etching is conducted using a condition in which an etching rate of the first doped semiconductor layer is lower than an etching rate of the second gate insulating film.

3. The method of manufacturing a semiconductor device according to claim 1,
    wherein the first gate insulating film, the first non-doped semiconductor film, and the first doped semiconductor film are formed successively, and
    wherein the second gate insulating film, the second non-doped semiconductor film, and the second doped semiconductor film are formed successively.

4. The method of manufacturing a semiconductor device according to claim 1,
    wherein the first non-doped semiconductor film and the second non-doped semiconductor film are amorphous semiconductor films or amorphous semiconductor films including microcrystals.

5. A method of manufacturing a semiconductor device, comprising:
    forming a first gate electrode and a second gate electrode;
    forming a first gate insulating film, a first non-doped semiconductor film, and a first doped semiconductor film including one of n-type and p-type conductivity in that order over the first gate electrode and the second gate electrode;
    removing the first non-doped semiconductor film and the first doped semiconductor film to form a first island-shaped semiconductor layer in which a first non-doped semiconductor layer and a first doped semiconductor layer are stacked in that order over the first gate electrode, and to expose the first gate insulating film formed over the second gate electrode;
    forming a second gate insulating film, a second non-doped semiconductor film, and a second doped semiconductor film including the other one of n-type and p-type conductivity in that order over the exposed first gate insulating film and the first island-shaped semiconductor layer;
    removing the second non-doped semiconductor film and the second doped semiconductor film by a first etching to form a second island-shaped semiconductor layer in which a second non-doped semiconductor layer and a second doped semiconductor layer are stacked in that order, and to expose the second gate insulating film formed over the first island-shaped semiconductor layer;
    removing the exposed second gate insulating film by a second etching to expose the first island-shaped semiconductor layer;

forming a wiring over the first island-shaped semiconductor layer and the second island-shaped semiconductor layer; and partially removing the first doped semiconductor film and the second doped semiconductor film using the wiring as a mask.

6. The method of manufacturing a semiconductor device according to claim 5, wherein the first etching is conducted using a condition in which an etching rate of the second gate insulating film is lower than an etching rate of the second non-doped semiconductor film, and wherein the second etching is conducted using a condition in which an etching rate of the first doped semiconductor layer is lower than an etching rate of the second gate insulating film.

7. The method of manufacturing a semiconductor device according to claim 5, wherein the first gate insulating film, the first non-doped semiconductor film, and the first doped semiconductor film are formed successively, and wherein the second gate insulating film, the second non-doped semiconductor film, and the second doped semiconductor film are formed successively.

8. The method of manufacturing a semiconductor device according to claim 5, wherein the first non-doped semiconductor film and the second non-doped semiconductor film are amorphous semiconductor films or amorphous semiconductor films including microcrystals.

9. A method of manufacturing a semiconductor device, comprising:

forming a first gate electrode and a second gate electrode;

forming a first gate insulating film, a first non-doped semiconductor film, and a first doped semiconductor film including one of n-type and p-type conductivity in that order over the first gate electrode and the second gate electrode;

removing the first non-doped semiconductor film and the first doped semiconductor film to form a first island-shaped semiconductor layer in which a first non-doped semiconductor layer and a first doped semiconductor layer are stacked in that order over the first gate electrode, and to expose the first gate insulating film formed over the second gate electrode;

removing the exposed first gate insulating film to expose the second gate electrode;

forming a second gate insulating film, a second non-doped semiconductor film, and a second doped semiconductor film including the other one of n-type and p-type conductivity in that order over the exposed second gate electrode and the first island-shaped semiconductor layer, wherein the second gate insulating film has a different thickness from the first gate insulating film;

removing the second non-doped semiconductor film and the second doped semiconductor film by a first etching to form a second island-shaped semiconductor layer in which a second non-doped semiconductor layer and a second doped semiconductor layer are stacked in that order over the second gate electrode, and to expose the second gate insulating film formed over the first island-shaped semiconductor layer;

removing the exposed second gate insulating film by a second etching to expose the first island-shaped semiconductor layer;

forming a wiring over the first island-shaped semiconductor layer and the second island-shaped semiconductor layer; and partially removing the first doped semiconductor film and the second doped semiconductor film using the wiring as a mask.

10. The method of manufacturing a semiconductor device according to claim 9, wherein the first etching is conducted using a condition in which an etching rate of the second gate insulating film is lower than an etching rate of the second non-doped semiconductor film, and wherein the second etching is conducted using a condition in which an etching rate of the first doped semiconductor layer is lower than an etching rate of the second gate insulating film.

11. The method of manufacturing a semiconductor device according to claim 9, wherein the first gate insulating film, the first non-doped semiconductor film, and the first doped semiconductor film are formed successively, and wherein the second gate insulating film, the second non-doped semiconductor film, and the second doped semiconductor film are formed successively.

12. The method of manufacturing a semiconductor device according to claim 9, wherein the first non-doped semiconductor film and the second non-doped semiconductor film are amorphous semiconductor films or amorphous semiconductor films including microcrystals.

13. A method of manufacturing a semiconductor device, comprising:

forming a first gate electrode and a second gate electrode;

forming a first gate insulating film, a first non-doped semiconductor film, and a first doped semiconductor film including one of n-type and p-type conductivity in that order over the first gate electrode and the second gate electrode;

removing the first non-doped semiconductor film and the first doped semiconductor film to form a first island-shaped semiconductor layer in which a first non-doped semiconductor layer and a first doped semiconductor layer are stacked in that order over the first gate electrode, and to expose the first gate insulating film formed over the second gate electrode;

forming a second gate insulating film, a second non-doped semiconductor film, and a second doped semiconductor film including the other one of n-type and p-type conductivity in that order over the exposed first gate insulating film and the first island-shaped semiconductor layer, wherein the second gate insulating film has a different thickness from the first gate insulating film;

removing the second non-doped semiconductor film and the second doped semiconductor film by a first etching to form a second island-shaped semiconductor layer in which a second non-doped semiconductor layer and a second doped semiconductor layer are stacked in that order, and to expose the second gate insulating film formed over the first island-shaped semiconductor layer;

removing the exposed second gate insulating film by a second etching to expose the first island-shaped semiconductor layer;

forming a wiring over the first island-shaped semiconductor layer and the second island-shaped semiconductor layer; and partially removing the first doped semiconductor film and the second doped semiconductor film using the wiring as a mask.

14. The method of manufacturing a semiconductor device according to claim 13,
wherein the first etching is conducted using a condition in which an etching rate of the second gate insulating film is lower than an etching rate of the second non-doped semiconductor film, and
wherein the second etching is conducted using a condition in which an etching rate of the first doped semiconductor layer is lower than an etching rate of the second gate insulating film.

15. The method of manufacturing a semiconductor device according to claim 13,
wherein the first gate insulating film, the first non-doped semiconductor film, and the first doped semiconductor film are formed successively, and
wherein the second gate insulating film, the second non-doped semiconductor film, and the second doped semiconductor film are formed successively.

16. The method of manufacturing a semiconductor device according to claim 13,
wherein the first non-doped semiconductor film and the second non-doped semiconductor film are amorphous semiconductor films or amorphous semiconductor films including microcrystals.

* * * * *